(12) United States Patent
Kim et al.

(10) Patent No.: US 11,264,547 B2
(45) Date of Patent: Mar. 1, 2022

(54) LIGHT EMITTING DEVICE HAVING A REFLECTIVE MEMBER

(71) Applicant: SEOUL SEMICONDUCTOR CO., LTD., Gyeonggi-do (KR)

(72) Inventors: Hye In Kim, Gyeonggi-do (KR); Jung Hun Son, Gyeonggi-do (KR)

(73) Assignee: SEOUL SEMICONDUCTOR CO., LTD., Gyeonggi-do (KR)

( * ) Notice: Subject to any disclaimer, the term of this patent is extended or adjusted under 35 U.S.C. 154(b) by 0 days.

(21) Appl. No.: 16/819,687

(22) Filed: Mar. 16, 2020

(65) Prior Publication Data

US 2020/0220057 A1    Jul. 9, 2020

Related U.S. Application Data

(63) Continuation of application No. PCT/KR2019/000360, filed on Jan. 9, 2019.

(30) Foreign Application Priority Data

Jan. 10, 2018   (KR) .................. 10-2018-0003312
Jan. 2, 2019    (KR) .................. 10-2019-0000235

(51) Int. Cl.
*H01L 33/60* (2010.01)
*H01L 25/075* (2006.01)
(Continued)

(52) U.S. Cl.
CPC .......... *H01L 33/60* (2013.01); *H01L 25/0753* (2013.01); *H01L 25/167* (2013.01); *H01L 33/20* (2013.01); *H01L 33/502* (2013.01)

(58) Field of Classification Search
CPC ... H01L 33/60; H01L 25/0753; H01L 33/502; H01L 33/54; H01L 25/167
See application file for complete search history.

(56) References Cited

U.S. PATENT DOCUMENTS 6,114,240 A  *  9/2000  Akram .................. H01L 25/105
                                                            438/667
2010/0067233 A1 * 3/2010  Bechtel ............... H01L 25/0753
                                                            362/260

(Continued)

FOREIGN PATENT DOCUMENTS

JP     2013207049      10/2013
JP     2015138838       7/2015
(Continued)

OTHER PUBLICATIONS

International Search Report for International Application PCT/KR2019/000360, dated Apr. 24, 2019.

*Primary Examiner* — Feifei Yeung Lopez
(74) *Attorney, Agent, or Firm* — Burris Law, PLLC

(57) ABSTRACT

A light-emitting device includes a substrate, a first light-emitting chip, a first wavelength conversion member, and a barrier member. The first light-emitting chip is mounted on the substrate. The first wavelength conversion member covers the upper surface of the first light-emitting chip. A first reflective member covers the side surface of the first wavelength conversion member. Further, the barrier member includes an outer wall surrounding the side surfaces of the first light-emitting chip and the first reflective member.

27 Claims, 16 Drawing Sheets

(51) Int. Cl.
*H01L 33/20* (2010.01)
*H01L 33/50* (2010.01)
*H01L 25/16* (2006.01)

(56) References Cited

U.S. PATENT DOCUMENTS

| | | | |
|---|---|---|---|
| 2011/0309388 A1* | 12/2011 | Ito | H01L 33/60 |
| | | | 257/89 |
| 2014/0117396 A1* | 5/2014 | Eisert | H01L 33/505 |
| | | | 257/98 |
| 2015/0102366 A1* | 4/2015 | Wada | H01L 33/505 |
| | | | 257/88 |
| 2015/0181711 A1* | 6/2015 | Nakabayashi | H01L 33/62 |
| | | | 257/99 |
| 2015/0236203 A1* | 8/2015 | Oh | H01L 33/24 |
| | | | 362/611 |
| 2016/0161098 A1* | 6/2016 | Tudorica | H01L 33/62 |
| | | | 315/51 |
| 2018/0212128 A1* | 7/2018 | Hayashi | H01L 33/507 |
| 2019/0035986 A1* | 1/2019 | Maeda | H01L 33/0095 |

FOREIGN PATENT DOCUMENTS

| | | |
|---|---|---|
| JP | 2017076719 | 4/2017 |
| KR | 1020110112539 | 10/2011 |

* cited by examiner

# LIGHT EMITTING DEVICE HAVING A REFLECTIVE MEMBER

CROSS-REFERENCE OF RELATED APPLICATIONS

This application is a continuation of PCT Application No. PCT/KR2019/000360, filed on Jan. 9, 2019, which claims priority under 35 U.S.C. § 119 of Korean Patent Application No. 10-2018-0003312, filed on Jan. 10, 2018 and Korean Patent Application No. 10-2019-0000235, filed on Jan. 2, 2019. The disclosure of the PCT Application No. PCT/KR2019/000360 and Korean Patent Application Nos. 10-2018-0003312 and 10-2019-0000235 are hereby incorporated by reference in their entirety

TECHNICAL FIELD

Embodiments of the present disclosure relate to a light emitting device.

BACKGROUND

A light emitting chip refers to a semiconductor device that emits light through recombination of electrons and holes. The light emitting chip is used in various fields, such as displays, vehicle lamps, general lighting, and the like. Since the light emitting chip has long lifespan, low power consumption, and rapid response rate, the light emitting chip is applied to various fields including vehicle lamps and displays.

FIG. 1 is a cross-sectional view of a conventional light emitting device 10. Referring to FIG. 1, the light emitting device 10 includes light emitting chips 11, wavelength conversion members 12, a barrier member 14, and a circuit board 15. The barrier member 14 is formed of a resin containing a reflective material. Thus, the barrier member 14 serves to reflect light emitted from the light emitting chips 11. However, in the conventional light emitting device 10, some fraction of light emitted from the light emitting chips 11, or having passed through a side surface of the wavelength conversion members 12, passes through the barrier member 14, instead of being reflected by the reflective material. In particular, the light emitting device 10 has a short distance between a side surface and an upper surface at a corner portion of the barrier member 14 adjacent to the wavelength conversion member 12. That is, a smaller amount of the reflective material is distributed at the corner portion of the barrier member 14 than other portions thereof, thereby allowing some fraction of light to pass through the corner portion of the barrier member 14. As a result, the light emitting device 10 suffers from light blurring caused by light leakage to a side surface thereof in addition to a front region thereof to be irradiated with light.

FIG. 2 is a graph depicting brightness of the conventional light emitting device. Referring to FIG. 2, Portion A1 shows that light is tenuously emitted from a portion of the barrier member 14 adjoining a first wavelength conversion member 12, instead of being completely blocked thereby. In addition, Portion B1 shows that light is also emitted from a portion of the barrier member 14 between the first wavelength conversion member 12 and a second wavelength conversion member 12. Further, Portion C1 shows that light is emitted from a portion of the barrier member 14 adjoining the second wavelength conversion member 12.

When light blurring occurs on a side surface of a light emitting device applied to a vehicle lamp, a cutoff line is not clearly formed at the border between a dark portion and a bright portion upon irradiation with light emitted in front of the vehicle lamp. As a result, an unnecessary region can be irradiated with light by a driver, thereby interfering with other driver's visual fields, and light can be emitted to a side of the light emitting device, thereby causing a problem of light loss.

SUMMARY

Embodiments of the present disclosure provide a light emitting device capable of preventing light blurring. Embodiments of the present disclosure provide a light emitting device capable of preventing light loss. Embodiments of the present disclosure provide a light emitting device capable of simultaneously preventing reduction in luminous area and light blurring.

In accordance with one embodiment of the present disclosure, a light emitting device includes a substrate, a first light emitting chip, a first wavelength conversion member, and a barrier member. The first light emitting chip is mounted on the substrate. The first wavelength conversion member covers an upper surface of the first light emitting chip. A first reflective member covers a side surface of the first wavelength conversion member. In addition, the barrier member includes an outer wall covering side surfaces of the first light emitting chip and the first reflective member.

The light emitting device according to embodiments of the present disclosure employs a reflective member to prevent light from passing through a barrier member, thereby preventing light blurring.

In addition, the light emitting device according to embodiments of the present disclosure can prevent light blurring, thereby preventing light loss.

Further, the light emitting device according to embodiments of the present disclosure can prevent light blurring, thereby securing other driver's long visual fields including vehicles at an opposite side when applied to a vehicle lamp.

Further, the light emitting device according to embodiments of the present disclosure can simultaneously prevent reduction in luminous area and light blurring using a reflective member.

DETAILED DESCRIPTION OF EMBODIMENTS

Figure 1:
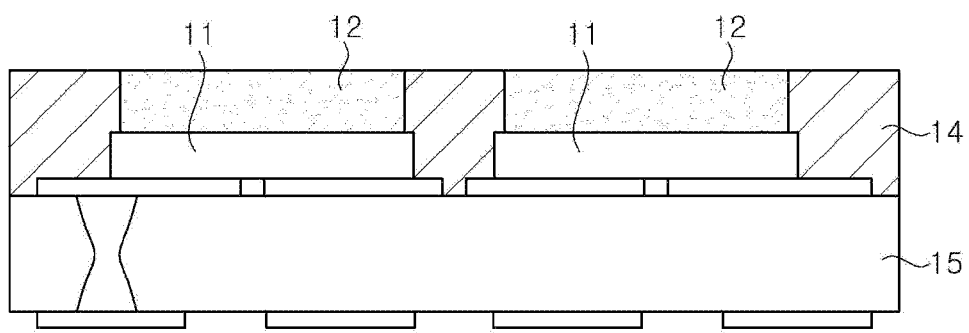
FIG. 1 is a cross-sectional view of a conventional light emitting device.
Figure 2:
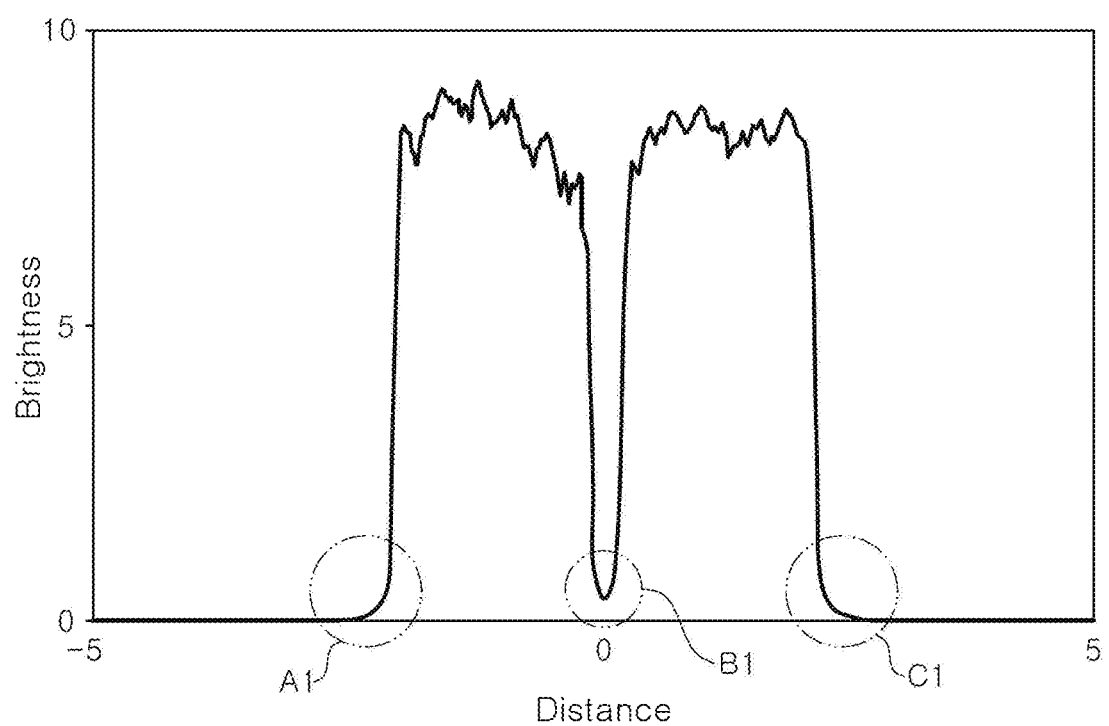
FIG. 2 is a graph depicting brightness of the conventional light emitting device.

Hereinafter, embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. Throughout the specification, like reference numerals denote like elements having the same or similar functions.

In accordance with one embodiment of the present disclosure, a light emitting device includes a substrate, a first light emitting chip, a first wavelength conversion member, and a barrier member. The first light emitting chip is mounted on the substrate. The first wavelength conversion member covers an upper surface of the first light emitting chip. The first reflective member covers a side surface of the first wavelength conversion member. In addition, the barrier member includes an outer wall covering side surfaces of the first light emitting chip and the first reflective member.

An upper portion of the outer wall of the barrier member may have a thickness gradually increasing from an upper surface thereof in a downward direction thereof. Alternatively, the barrier member may have a flat upper surface.

For example, the first light emitting chips may be mounted in plural on the substrate.

An upper portion of the outer wall of the barrier member disposed between the first light emitting chip and a side surface of the substrate may have a thickness gradually increasing from an upper surface thereof in a downward direction thereof. In addition, an inner wall of the barrier member disposed between the first light emitting chips may have a convex upper portion.

Further, the outer wall of the barrier member may contain a larger amount of fillers than the inner wall thereof.

The light emitting device may include the first wavelength conversion member and the first reflective member on each of the first light emitting chips.

Here, each of the first reflective members may be spaced apart from another first reflective member adjacent thereto.

For example, the first reflective member may cover a side surface of the wavelength conversion member and a side surface of the first light emitting chip.

The first reflective member may include at least one selected from silver (Ag) and aluminum (Al).

The first wavelength conversion member may have a greater width than or the same width as the first light emitting chip.

The first wavelength conversion member may include a mixture of a wavelength conversion material and one of an epoxy resin, a silicone resin, glass and a ceramic material. The first wavelength conversion member may further include a reflective material.

For example, the light emitting device may further include a second reflective member covering an upper surface of the barrier member.

The second reflective member may be disposed to contact an upper surface of the first reflective member.

The second reflective member may cover the upper surface of the first reflective member or may be formed along a periphery of the upper surface of the first reflective member, and may cover a portion of the upper surface of the barrier member. Alternatively, the second reflective member may cover the entirety of the upper surface of the barrier member or may cover the entirety of the upper surface of the barrier member and the upper surface of the first reflective member.

The second reflective member may include at least one selected from silver (Ag) and aluminum (Al).

The substrate may be a circuit board including an insulation layer and a circuit pattern.

The circuit pattern may include a first circuit pattern, a second circuit pattern, and a via. The first circuit pattern may be formed on an upper surface of the insulation layer and may be electrically connected to the first light emitting chip. The second circuit pattern may be formed on a lower surface of the insulation layer. In addition, the via may electrically connect the first insulation pattern to the second insulation pattern through the insulation layer.

One end of the first circuit pattern may be disposed in the middle between one side surface of the first light emitting chip and the outer wall of the barrier member. Alternatively, one end of the first circuit pattern may be disposed between the outer wall of the barrier member and the middle between one side surface of the first light emitting chip and the outer wall of the barrier member.

The via may have a width gradually decreasing from upper and lower surfaces of the insulation layer to an interior thereof.

The plurality of first light emitting chips may be arranged parallel to each other from one side of the substrate to the other side thereof. Here, the first wavelength conversion member may have a width equal to a width from one side surface of the first light emitting chip disposed at the one side to one side surface of the first light emitting chip disposed at the other side. Here, the one side surface of the first light emitting chip may face an inner wall of the barrier member.

For example, the light emitting device may further include a second light emitting chip spaced apart from the first light emitting chip in a lateral direction. The second light emitting chip may be disposed such that one side surface of the second light emitting chip faces one side surface of the first light emitting chip.

The light emitting device may further include a second wavelength conversion member covering an upper surface of the second light emitting chip.

The second wavelength conversion member may include a mixture of a wavelength conversion material and one of an epoxy resin, a silicone resin, glass and a ceramic material.

The first wavelength conversion member and the second wavelength conversion member may include different wavelength conversion materials to convert light into different wavelengths.

The barrier member may further include an inner wall disposed between the first light emitting chip and the second light emitting chip. Here, the inner wall of the barrier member may have a convex upper surface.

The outer wall of the barrier member may contain a larger amount of fillers than the inner wall thereof.

The light emitting device may further include a protective member disposed between the first reflective member and the barrier member to protect the first reflective member.

The protective member may include at least one layer selected from a silicon nitride (SiNx) layer, a silicon oxide (SiO$_2$) layer and a gold (Au) layer.

The second wavelength conversion member may further include a reflective material.

Hereinafter, various embodiments of the present disclosure will be described with reference to the accompanying drawings.

Figure 3:
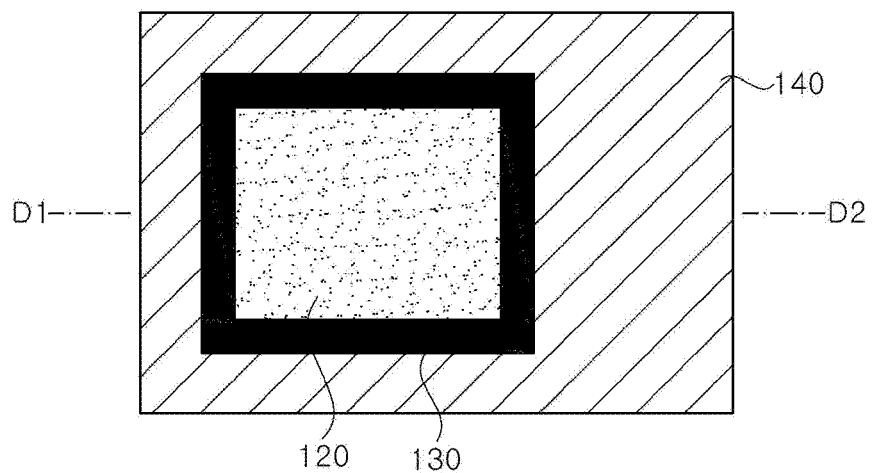
FIG. 3 and FIG. 4 are views of a light emitting device according to a first embodiment of the present disclosure.
Figure 4:
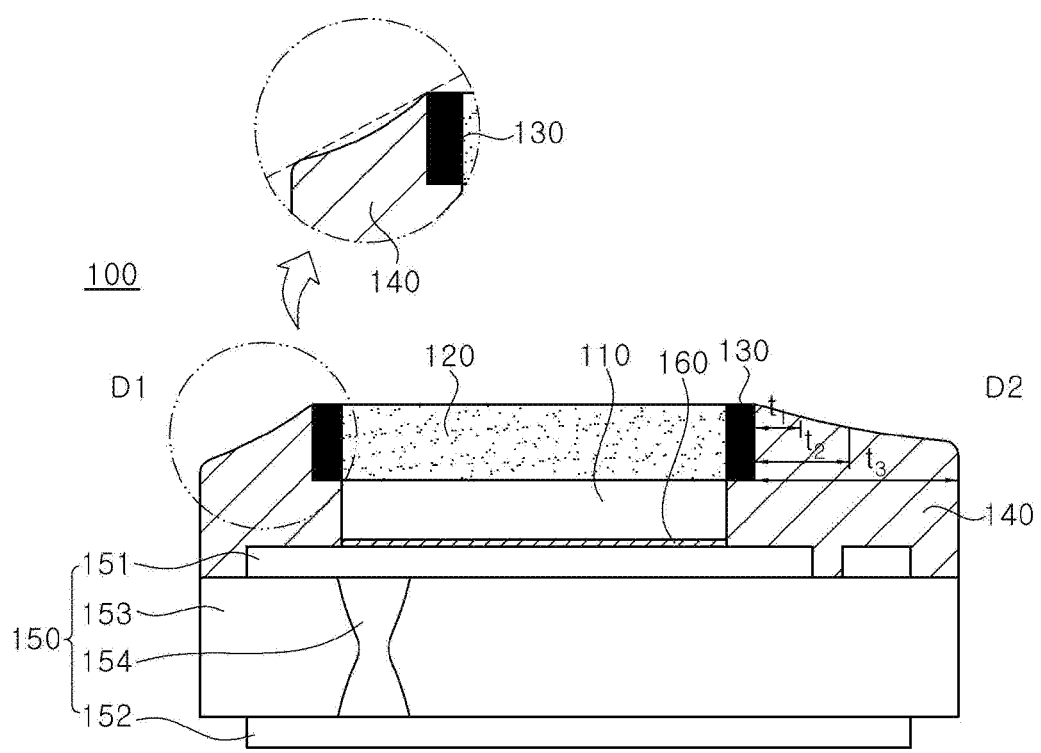

FIG. 3 and FIG. 4 are views of a light emitting device according to a first embodiment of the present disclosure. FIG. 3 is a top view of the light emitting device 100 according to the first embodiment. FIG. 4 is a cross-sectional view of the light emitting device 100 according to the first embodiment.

Referring to FIG. 3 and FIG. 4, the light emitting device 100 includes a light emitting chip 110, a wavelength conversion member 120, a reflective member 130, a barrier member 140, and a circuit board 150.

The light emitting chip 110 may be a light emitting diode chip that emits light. The light emitting chip 110 is disposed on the circuit board 150 to be electrically connected to the circuit board 150. For example, the light emitting chip 110 may be formed at a lower side thereof with electrode pads (not shown). Here, the electrode pads of the light emitting chip 110 may be electrically connected to a first circuit pattern 151 formed on an upper surface of the circuit board 150 via an electrically conductive bonding material.

The wavelength conversion member 120 is disposed on the light emitting chip 110. The wavelength conversion member 120 may be formed to cover an upper surface of the light emitting chip 110. The wavelength conversion member 120 may have the same width as the light emitting chip 110. That is, side surfaces of the wavelength conversion member 120 may be disposed collinearly with side surfaces of the light emitting chip. The wavelength conversion member 120 serves to convert light emitted from the light emitting chip 110 so as to emit white light or a particular color.

The wavelength conversion member 120 may be formed of a mixture of a transparent resin, such as a silicone resin or an epoxy resin, glass or a ceramic material and a wavelength conversion material that converts wavelengths of light. For example, the transparent resin may be a transparent silicone resin. The wavelength conversion material may be phosphors. The phosphors may include yellow phosphors, red phosphors, green phosphors, and the like.

Examples of the yellow phosphors may include YAG:Ce (T$_3$Al$_5$O$_{12}$:Ce)-based phosphors, which are cerium (Ce)-doped yttrium (Y)-aluminum (Al) garnets, and silicate-based phosphors, which have a main wavelength of 530 nm to 570 nm.

Examples of the red (R) phosphors may include YOX (Y$_2$O$_3$:EU))-based phosphors composed of a compound of yttrium oxide (Y$_2$O$_3$) and europium (Eu), and nitride phosphors, which have a main wavelength of 611 nm.

Examples of the green (G) phosphors may include LAP (LaPO$_4$:Ce,Tb)-based phosphors having a main wavelength of 544 nm and composed of a compound of phosphate (PO$_4$), lanthanum (La) and terbium (Tb).

Examples of the blue (B) phosphors may include BAM (BaMgAl$_{10}$O$_{17}$:EU)-based phosphors having a main wavelength of 450 nm and composed of a compound of a barium (Ba), magnesium (Mg), aluminum oxide material and europium (Eu).

The phosphors may include fluoride compound KSF phosphors (K$_2$SiF$_6$), which are Mn$^{4+}$ active phosphors advantageous for high color reproduction.

For example, the wavelength conversion member 120 may be formed of phosphor-in-glass (PIG) which is a mixture of glass and phosphors. The wavelength conversion member 120 formed of PIG can efficiently prevent intrusion of foreign matter, such as moisture, dust and the like, into the light emitting device 100.

The wavelength conversion member 120 may further contain a reflective material. The reflective material may have a melting point so as not to be melted upon sintering of the wavelength conversion member 120. For example, the wavelength conversion member 120 formed of PIG may further contain silicon dioxide (SiO$_2$) as the reflective material.

The reflective member 130 is formed to surround side surfaces of the wavelength conversion member 120, as shown in FIGS. 3 and 4. The reflective member 130 prevents light emitted from the light emitting chip 110 from passing through the barrier member 140. That is, the reflective member 130 reflects light. Alternatively, the reflective member 130 may be formed of a material capable of reflecting light. The reflective member 130 may absorb a portion of light, but does not allow the light to pass therethrough. For example, the reflective member 130 may be formed of at least one selected from silver (Ag) and aluminum (Al). The reflective member 130 formed of silver has high reflectivity with respect to light. The reflective member 130 formed of aluminum exhibits high adhesion to the wavelength conversion member 120 or the barrier member 140. In this way, the reflective member 130 may have a single layer structure composed of silver or aluminum with reference to reflectivity or adhesion. Alternatively, the reflective member 130 may have a multilayer structure of aluminum-silver-aluminum to enhance both adhesion and reflectivity. Although not shown in the drawings, at least one layer composed of nickel (Ni) and titanium (Ti) may be further disposed on the reflective member 130. It should be noted that the material for the reflective member 130 is not limited to aluminum and silver and may include any material capable of reflecting light emitted from the light emitting chip 110.

The barrier member 140 is formed to surround the side surfaces of the reflective member 130 and the light emitting chip 110. For example, the barrier member 140 may be formed of a silicone resin. Alternatively, the barrier member 140 may be formed of a silicone resin containing a reflective material.

Conventionally, in order to secure alignment of the light emitting chip and the wavelength conversion member while preventing light blurring, the wavelength conversion member has a lower surface having a smaller area than the upper surface of the light emitting chip. However, when the lower surface of the wavelength conversion member has a smaller area than the upper surface of the light emitting chip, the overall intensity of light emitted from the light emitting device may be reduced.

In this embodiment, the light emitting device 100 is formed such that the upper surface of the light emitting chip 110 has the same area as the lower surface of the wavelength conversion member 120. In another embodiment, in order to increase the intensity of light emitted from the light emitting device, the lower surface of the wavelength conversion member 120 may be formed to have a larger area than the upper surface of the light emitting chip 110. Here, in the light emitting device 100 according to this embodiment, since the area of the wavelength conversion member 120 is increased, the thickness of the side surface of the barrier member 140 is relatively reduced. However, since light emitted from the light emitting chip 110 is reflected by the reflective member 130, the light emitting device 100 can prevent light blurring due to transmission of the light through the barrier member 140.

More preferably, in consideration of the overall luminous intensity and brightness, the light emitting device 100 is formed such that the upper surface of the light emitting chip 110 has the same area as the lower surface of the wavelength conversion member 120, as shown in FIG. 4. Here, the reflective member 130 prevents light emitted from the light emitting chip 110 from passing through the barrier member 140, thereby preventing light blurring.

With the structure wherein not only the reflective member 130 but also the wavelength conversion member 120 further contains the reflective material, the light emitting device 100 can achieve further improvement in the effect of reflecting light so as not to prevent the light from passing through the barrier member 140.

According to this embodiment, the side surface of the reflective member 130 is formed to protrude relative to the light emitting chip 110, as shown in FIG. 4. Accordingly, the light emitting device has a larger bonding area of the barrier member 140 to components inside the barrier member 140 than a structure where the reflective member 130 is not present. As a result, coupling strength between the barrier member 140, the reflective member 130 and the light emitting chip 110 increases.

According to this embodiment, in order to prevent the barrier member 140 from covering an upper surface of the wavelength conversion member 120, a material for the barrier member 140 is deposited to a smaller height than the wavelength conversion member 120. Here, the barrier member 140 has a structure wherein an upper surface of the barrier member 140 has a height gradually decreasing from an inner wall to an outer wall, as shown in FIG. 4. That is, an upper portion of the barrier member 140 has a gradually increasing thickness in a downward direction thereof. Referring to FIG. 4, the thickness of the barrier member 140 gradually increases in the sequence of portion t1 of the barrier member 140 formed at one side of an upper portion of the reflective member 130, portion t2 of the barrier member 140 formed at one side between the upper portion of the reflective member 130 and a lower portion thereof, and portion t3 of the barrier member 140 formed at one side of the lower portion of the reflective member 130.

According to this embodiment, the reflective member 130 is disposed between the wavelength conversion member 120 and the barrier member 140. Accordingly, light emitted from the light emitting chip and traveling towards the wavelength conversion member 120 is reflected by the reflective member 130, thereby preventing transmission of light through the barrier member 140. As a result, the light emitting device can prevent light blurring around the periphery of the wavelength conversion member 120. In addition, even with the structure wherein the barrier member 140 is formed to a smaller height than the wavelength conversion member 120 such that the upper portion of the barrier member 140 has a gradually decreasing thickness, the light emitting device can prevent light blurring using the reflective member 130. Further, the light emitting device 100 according to this embodiment can prevent unnecessary light leakage using the reflective member 130, thereby preventing light loss.

Further, the light emitting device includes the reflective member 130 that reflects light, whereby the barrier member 140 can be formed to a small thickness, thereby enabling reduction in width or size of the light emitting device.

The circuit board 150 includes an insulation layer 153, a first circuit pattern 151, a second circuit pattern 152, and a via hole 154. The insulation layer 153 may be formed of a typical insulation material such as an epoxy resin or prepreg, generally used for a printed circuit board.

The first circuit pattern 151 is formed on an upper surface of the insulation layer 153. The first circuit pattern 151 is electrically connected to the electrode pad of the light emitting chip 110. An electrically conductive bonding material 160 may be formed for bonding between the light emitting chip 110 and the first circuit pattern 151. For example, the bonding material 160 may include one of a solder paste including Sn and at least one selected from Pb, Cu, Ag, Au, Zn, Al, Bi, and In, a silver (Ag) paste, and a silicon (Si) paste. It should be understood that the bonding material 160 is not limited to these pastes and may include any electrically conductive material capable of bonding the circuit board 150 to the light emitting chip 110.

The second circuit pattern 152 is formed on a lower surface of the insulation layer 153. Although not shown in the drawings, the second circuit pattern 152 is electrically connected to an external component.

The via hole 154 is formed to pass through the insulation layer 153. The via hole 154 may be formed by forming a through-hole in the insulation layer 153, followed by filling the through-hole with an electrically conductive material.

The first circuit pattern 151, the second circuit pattern 152 and the via hole 154 are formed of a typical electrically conductive material well-known in the field of circuit boards. For example, the first circuit pattern 151, the second circuit pattern 152 and the via hole 154 may be formed of copper (Cu).

The first circuit pattern 151 may have one end disposed at least between one side surface of the light emitting chip 110 and the outer wall of the barrier member 140. That is, the first circuit pattern 151 may be formed to have a length that allows the one end of the first circuit pattern to be placed in the middle between one side surface of the light emitting chip 110 and the outer wall of the barrier member 140 or between the middle and the outer wall of the barrier member 140. The first circuit pattern 151 is not exposed from the barrier member 140 and is formed over an area as large as possible, thereby improving heat dissipation of the light emitting device 100. The second circuit pattern 152 may also be formed to have a long length like the first circuit pattern 151. Thus, the second circuit pattern has a large area, thereby improving heat dissipation of the light emitting device 100. Further, the structure of the second circuit pattern 152 having a long length increases the length of a moisture penetration path between the insulation layer 153 and the second circuit pattern 152, thereby preventing moisture from affecting the light emitting chip 110. Furthermore, the bonding strength of the first circuit pattern 151 and the second circuit pattern 152 to the insulation layer 153 also increases.

The via hole 154 has a gradually decreasing width from the upper surface of the insulation layer 153 to the lower surface thereof. With this structure, the via hole 154 increases the length of the moisture penetration path, thereby preventing moisture from affecting the light emitting chip 110. In addition, a bonding area between the via hole 154 and the insulation layer 153 increases, thereby increasing coupling strength between the via hole 154 and the insulation layer 153.

In a conventional light emitting device which does not include the reflective member 130 as described according to this embodiment, the barrier member contains a reflective material. However, the barrier member containing the reflective material allows some fraction of light to pass through an upper portion of the barrier member. This is caused by a low density of the reflective material due to a small thickness of the upper portion of the barrier member or a corner portion thereof even with the structure where the upper portion of the barrier member is not thin. As a result, the conventional light emitting device may show light blurring along the periphery of the wavelength conversion member 120. If the conventional light emitting device applied to a vehicle lamp suffers from severe light blurring, it is necessary to adjust lamp lighting to face downwards so as not to interfere with other drivers' visual fields. As such, a vehicle lamp including the conventional light emitting device has a restricted lighting distance.

As in the embodiment of the present disclosure, if the problem of light blurring can be solved using the reflective member 130, it is possible to secure a longer visual field of a vehicle driver without interfering with visual fields of other vehicle drivers including drivers of vehicles in an opposite direction.

The following description will be given as to other embodiments of the present disclosure. Here, detailed description of the same components as those of the first embodiment will be omitted. For the omitted description, refer to the description of the light emitting device 100 according to the above embodiment shown in FIG. 3 and FIG. 4.

Figure 5:
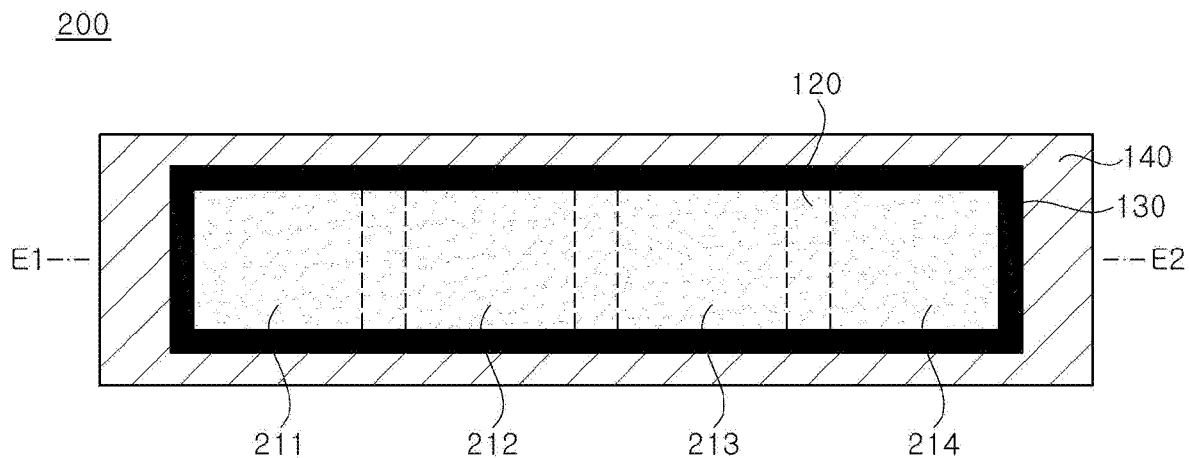
FIG. 5 and FIG. 6 are views of a light emitting device according to a second embodiment of the present disclosure.
Figure 6:
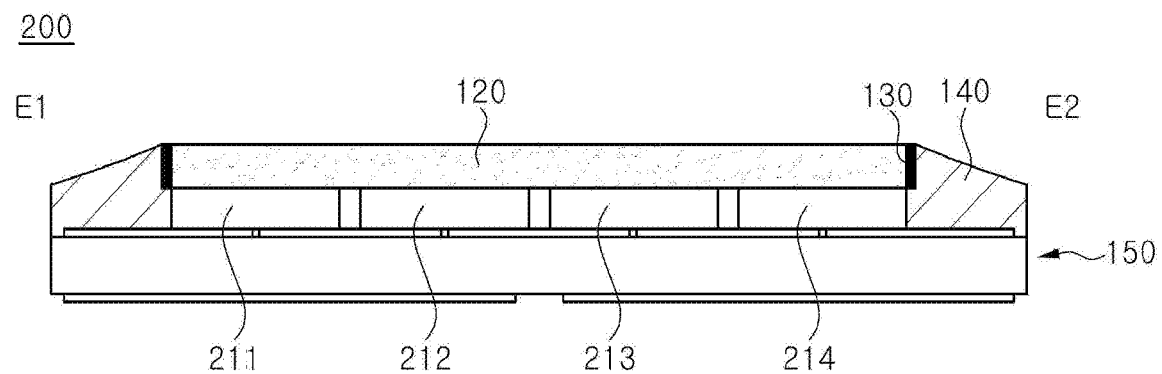

FIG. 5 and FIG. 6 are views of a light emitting device according to a second embodiment of the present disclosure. FIG. 5 is a top view of the light emitting device 200 according to the second embodiment. FIG. 6 is a cross-sectional view of the light emitting device 200 according to the second embodiment.

The light emitting device 200 according to the second embodiment includes a plurality of light emitting chips, a wavelength conversion member 120, a reflective member 130, a barrier member 140, and a circuit board 150. Referring to FIG. 5 and FIG. 6, the plurality of light emitting chips may include first to fourth light emitting chips 211 to 214. Although four light emitting chips are illustrated in this embodiment, the number of light emitting chips may be changed.

The first to fourth light emitting chips 211 to 214 may emit the same color, or at least one of the first to fourth light emitting chips 211 to 214 may emit light of a different color. According to this embodiment, the first to fourth light emitting chips 211 to 214 are separated from each other in a longitudinal direction of the light emitting device 200. However, it should be understood that arrangement of the light emitting chips may be modified in various ways in other embodiments.

The wavelength conversion member 120 is disposed to cover an upper surface of each of the first to fourth light emitting chips 211 to 214. Here, the wavelength conversion member 120 may have a width equal to a width from one side of the first light emitting chip 211 disposed at one side of the substrate to one side of the fourth light emitting chip 214 disposed at the other side thereof. That is, one side surface of the wavelength conversion member 120 may be collinear with one side surface of the first light emitting chip 211 and the other side surface of the wavelength conversion member 120 may be collinear with one side surface of the fourth light emitting chip 214. Here, the one side surface of the first light emitting chip 211 refers to a side surface thereof opposite to a side surface of the first light emitting chip 211 facing the second light emitting chip 212. In addition, the other side surface of the fourth light emitting chip 214 refers to a side surface thereof opposite to a side surface of the fourth light emitting chip 214 facing the third light emitting chip 213. That is, the one side surface of the first light emitting chip 211 and the one side surface of the fourth light emitting chip 214 face an inner wall of the barrier member 140, as shown in FIG. 6.

Here, the wavelength conversion member 120 may have a thickness set in consideration of viewing angle of the first to fourth light emitting chips 211 to 214 disposed adjacent to one another. For example, the wavelength conversion member 120 may have a thickness to allow at least some fractions of light emitted from adjacent light emitting chips to cross each other inside the wavelength conversion member 120. Further, the wavelength conversion member 120 may have a thickness to allow at least some fractions of light emitted from adjacent light emitting chips to cross each other at a central portion of the wavelength conversion member 120.

The reflective member 130 is formed to surround the side surfaces of the wavelength conversion member 120 formed to cover the upper surfaces of the first to fourth light emitting chips 211 to 214.

As such, the light emitting device 200 according to the second embodiment includes the plurality of light emitting chips and thus has an elongated luminous surface. In addition, the light emitting device 200 according to the second embodiment includes the reflective member 130 surrounding the wavelength conversion member 120, thereby preventing light blurring around the wavelength conversion member 120.

Figure 7:
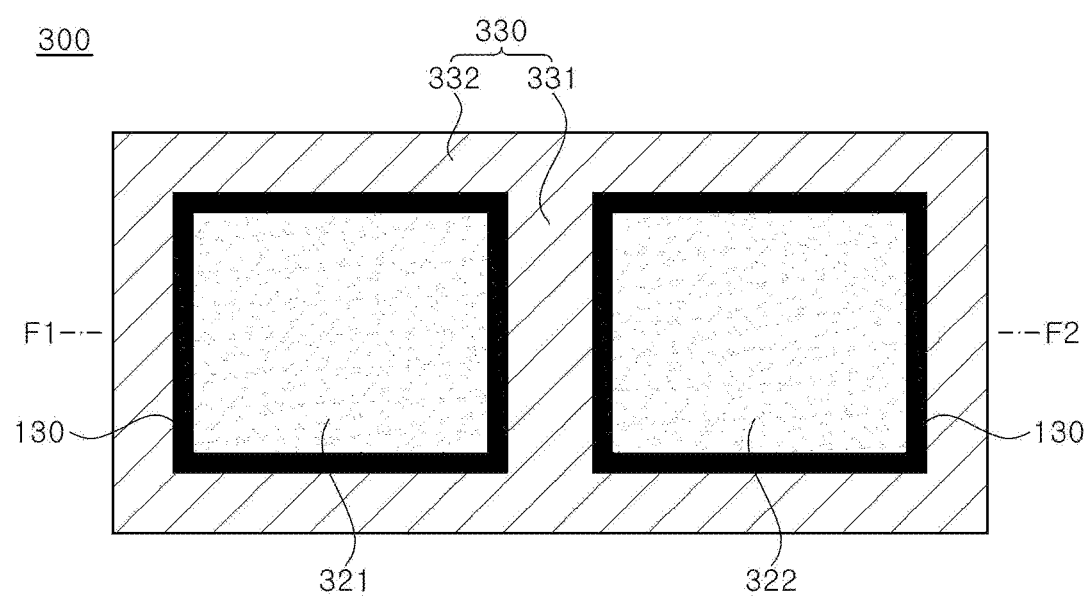
FIG. 7 and FIG. 8 are views of a light emitting device according to a third embodiment of the present disclosure.
Figure 8:
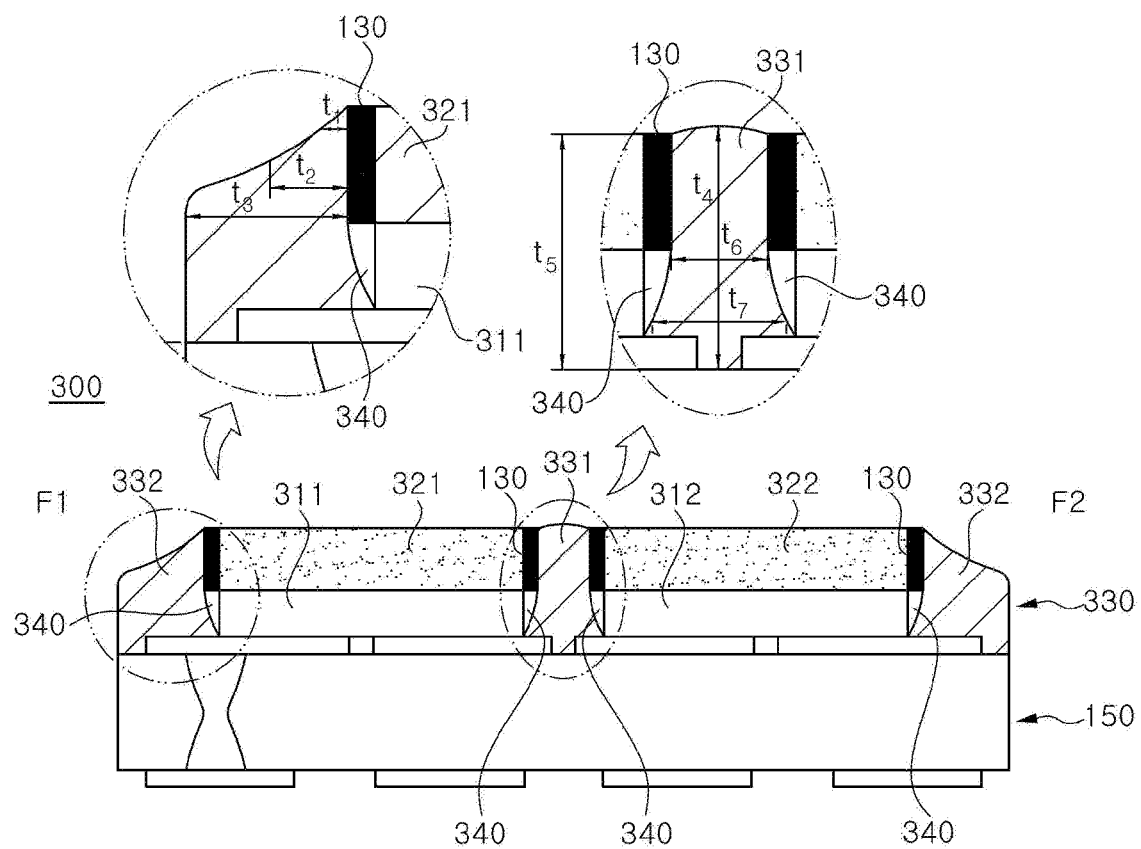

FIG. 7 and FIG. 8 are views of a light emitting device according to a third embodiment of the present disclosure. FIG. 7 is a top view of the light emitting device 300 according to the third embodiment. FIG. 8 is a cross-sectional view of the light emitting device 300 according to the third embodiment.

The light emitting device 300 according to the third embodiment includes a first light emitting chip 311, a second light emitting chip 312, a first wavelength conversion member 321, a second wavelength conversion member 322, a reflective member 130, a barrier member 330, and a circuit board 150.

The first light emitting chip 311 is spaced apart from the second light emitting chip 312 in a lateral direction. The barrier member 330 is disposed between the first light emitting chip 311 and the second light emitting chip 312.

The first wavelength conversion member 321 is disposed on an upper surface of the first light emitting chip 311 and the second wavelength conversion member 322 is disposed on the second light emitting chip 312.

The first wavelength conversion member 321 and the second wavelength conversion member 322 may be formed of a mixture of a transparent resin, such as a silicone resin or an epoxy resin, glass or a ceramic material and a wavelength conversion material that converts wavelengths of light.

In some embodiments, light having passed through the first wavelength conversion member 321 may have a different color from light having passed through the second wavelength conversion member 322. The first light emitting chip 311 and the second light emitting chip 312 may emit light having the same wavelength, and the first wavelength conversion member 321 and the second wavelength conversion member 322 may contain different wavelength conversion materials that convert light into different wavelengths. Alternatively, the first light emitting chip 311 and the second light emitting chip 312 may emit light having different wavelengths, and the first wavelength conversion member 321 and the second wavelength conversion member 322 may contain different wavelength conversion materials. For example, light generated through combination of the first light emitting chip 311 and the first wavelength conversion member 321 may be white light and light generated through combination of the second light emitting chip 312 and the second wavelength conversion member 322 may be yellow light. Here, white light may be used for a lighting lamp for securing a vehicle driver's visual field and yellow light may be used for a warning lamp for informing a vehicle driver of danger or emergency.

As in the first embodiment, the first wavelength conversion member 321 and the second wavelength conversion member 322 may further include a reflective material (not shown) to improve reflectivity of light.

The reflective member 130 is formed to surround side surfaces of each of the first wavelength conversion member 321 and the second wavelength conversion member 322. Light having passed through the side surfaces of the first wavelength conversion member 321 is reflected by the reflective member 130. In addition, light having passed through the side surfaces of the second wavelength conversion member 322 is reflected by the reflective member 130. Accordingly, the light emitting device can prevent light blurring at the periphery of each of the first wavelength conversion member 321 and the second wavelength conversion member 322.

Figure 9:
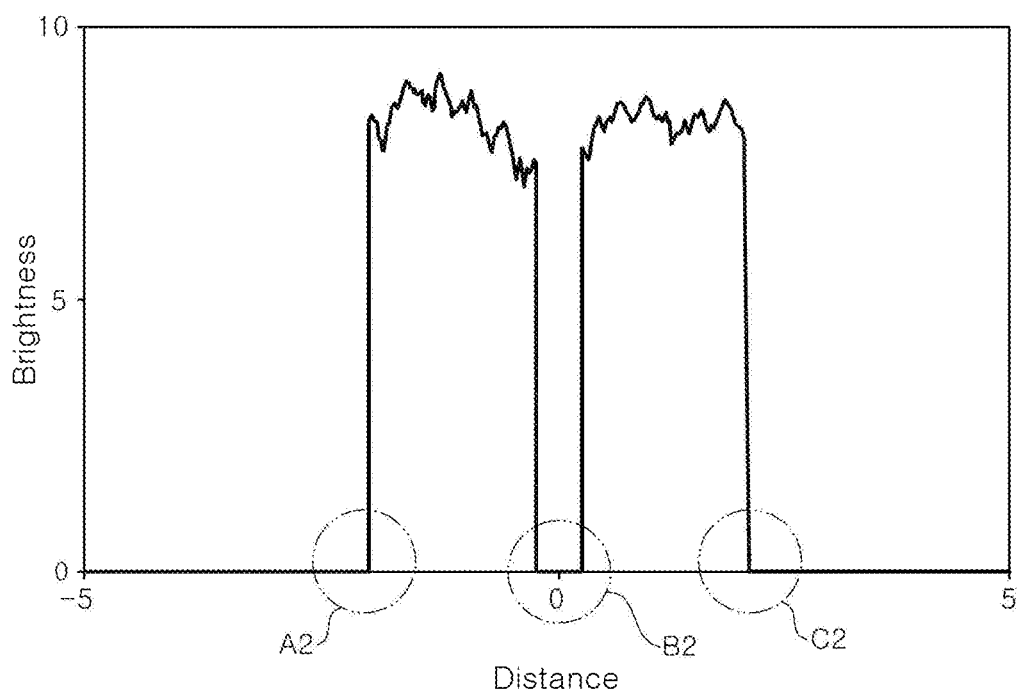
FIG. 9 is a graph depicting brightness of the light emitting device according to the third embodiment of the present disclosure.

FIG. 9 is a graph depicting brightness of the light emitting device according to the third embodiment of the present disclosure. FIG. 9 shows brightness of light depending upon distance from a center of the light emitting device 300.

Referring to FIG. 9, Portion A2 shows that light is completely blocked between the first wavelength conversion member 321 and the barrier member 330. In addition, Portion B2 shows that light is not emitted through the barrier member 330 between the first wavelength conversion member 321 and the second wavelength conversion member 322. Further, Portion C2 shows that light is completely blocked between the second wavelength conversion member 322 and the barrier member 330. As such, the light emitting device 300 according to this embodiment can prevent light from passing through the barrier member 330 using the reflective member 130. Accordingly, the light emitting device 300 according to this embodiment can prevent light blurring around the periphery of each of the first wavelength conversion member 321 and the second wavelength conversion member 322. As a result, the light emitting device 300 according to this embodiment can prevent interference of light having two different colors while allowing simultaneous emission of light through the first wavelength conversion member 321 and the second wavelength conversion member 322.

According to this embodiment, the barrier member 330 may be divided into an outer wall 332 and an inner wall 331, as shown in FIG. 8. The inner wall 331 refers to a portion of the barrier member 330 formed between the first light emitting chip 311 and the second light emitting chip 312 and between the first wavelength conversion member 321 and the second wavelength conversion member 322.

The outer wall 332 refers to a portion of the barrier member 330 formed to surround an outer periphery constituted by the first light emitting chip 311 and the first wavelength conversion member 321, the second light emitting chip 312, the second wavelength conversion member 322, and the inner wall 331. That is, the outer wall 332 is formed to surround side surfaces of components inside the light emitting device 300.

The outer wall 332 of the barrier member 330 is formed to have an upper surface having a height gradually decreasing from the inner wall to the outer wall. That is, an upper portion of the outer wall 332 of the barrier member 330 has a thickness gradually increasing in a downward direction thereof. In addition, the inner wall 331 of the barrier member 330 has a convex upper surface. For example, referring to FIG. 8, the thickness of the outer wall 332 of the barrier member 330 gradually increases in the sequence of portion t1 of the barrier member 140 formed at one side of an upper portion of the reflective member 130, portion t2 of the barrier member 140 formed at one side between the upper portion of the reflective member 130 and a lower portion thereof, and portion t3 of the barrier member 140 formed at one side of the lower portion of the reflective member 130. In addition, an inner portion of the inner wall 331 of the barrier member 330 has a height t4 that is greater than height t5 of both sides thereof.

The structures of the outer wall 332 and the inner wall 331 are obtained through deposition of a material for the barrier member 330 in consideration of a narrow space between the first light emitting chip 311 and the second light emitting chip 312.

Upon deposition of the material for the barrier member 330 into a space, in which the barrier member 330 will be formed, with reference to the outer wall 332 formed in a wider space than the inner wall 331, the material may cover the upper surfaces of the first wavelength conversion member 321 and the second wavelength conversion member 322 in a narrow space. As a result, the light emitting device 300 is decreased in luminous area. Accordingly, for the light emitting device 300 according to this embodiment, the material for the barrier member 330 is deposited into a space, in which the barrier member 330 will be formed, with reference to a space in which the inner wall 331 will be formed. Accordingly, the material for the barrier member 330 is deposited to a sufficient height in a space between the first light emitting chip 311 and the second light emitting chip 312, and is deposited to a lower height in other spaces than the upper surface of each of the first wavelength conversion member 321 and the second wavelength conversion member 322. As the deposited material is cured, the upper surface of the outer wall 332 bulges along the side surfaces of the reflective member 130 and the upper surface of the inner wall 331 has a convex shape. That is, although the upper portion of the outer wall 332 has a thin structure, the light emitting device 300 according to this embodiment includes the reflective member 130, thereby preventing light blurring despite the thin structure of the upper portion of the outer wall 332. Accordingly, the light emitting device 300 according to this embodiment can solve the problems of reduction in luminous area and light blurring.

The convex upper surface of the inner wall 331 protrudes above the upper surfaces of the first light emitting chip 311 and the second light emitting chip 312. That is, the inner wall 331 has a sufficient height between the first light emitting chip 311 and the second light emitting chip 312. With this structure, the inner wall 331 can prevent light emitted from the first and second light emitting chips 311, 312 from crossing or interfering with each other.

The light emitting device 300 according to this embodiment may further include light extraction members 340, as shown in FIG. 8. The light extraction member 340 may be formed to cover the side surfaces of each of the first light emitting chip 311 and the second light emitting chip 312. In addition, the light extraction members 340 may be formed such that an outer wall of the light extraction member facing the barrier member 330 has a radius of curvature. In the light emitting device 300 according to this embodiment, both side surfaces of the first light emitting chip 311 are collinear with both side surfaces of the first wavelength conversion member 321 and both side surfaces of the second light emitting chip 312 are collinear with both side surfaces of the second wavelength conversion member 322. Accordingly, the light extraction member 340 formed on both side surfaces of each of the first light emitting chip 311 and the second light emitting chip 312 is formed to cover the lower surface of the reflective member 130.

The light extraction member 340 formed on the side surfaces of the first light emitting chip 311 reflects light emitted through the side surfaces of the first light emitting chip 311 toward the first wavelength conversion member 321. In addition, the light extraction member 340 formed on the side surfaces of the second light emitting chip 312 reflects light emitted through the side surfaces of the second light emitting chip 312 toward the second wavelength conversion member 322.

According to this embodiment, the light extraction member 340 is formed to a thickness gradually decreasing from an upper portion of each of the first light emitting chip 311 and the second light emitting chip 312 to a lower portion thereof and has a curved outer wall. Accordingly, a lower portion of the side surface of the inner wall 331 has a curved surface. In addition, the lower portion of the inner wall 331 has a greater thickness t7 than a portion of the inner wall 331 adjacent to an upper portion of the light extraction member 340 and having a thickness t6, as shown in FIG. 8.

For example, the light extraction member 340 may be formed of a silicone resin. Alternatively, the light extraction member 340 may be formed of a mixture of a silicone resin and a reflective material.

Figure 10:
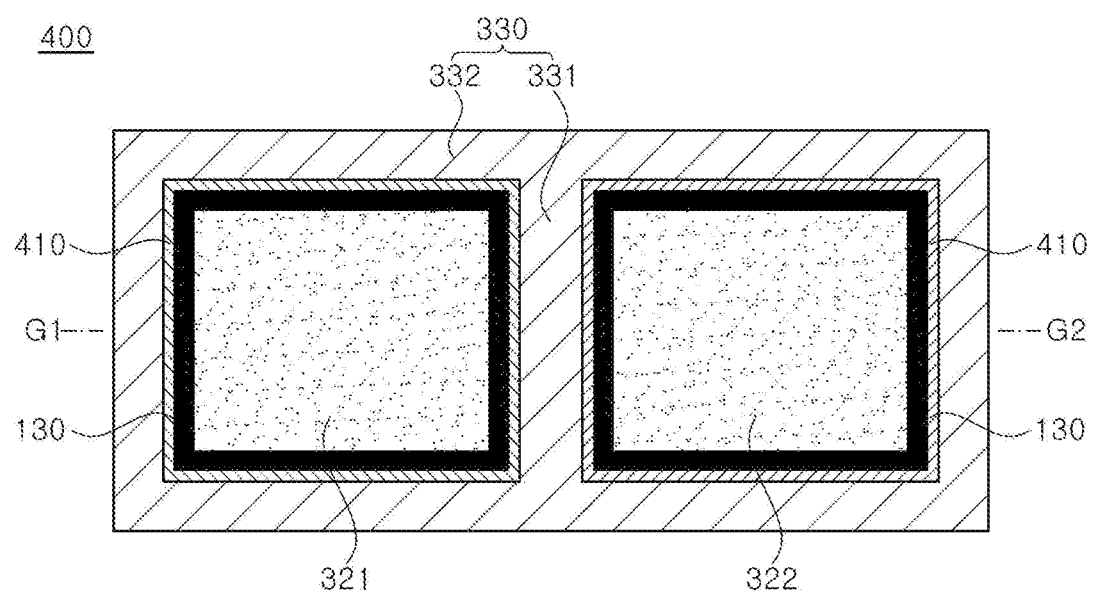
FIG. 10 and FIG. 11 are views of a light emitting device according to a fourth embodiment of the present disclosure.
Figure 11:
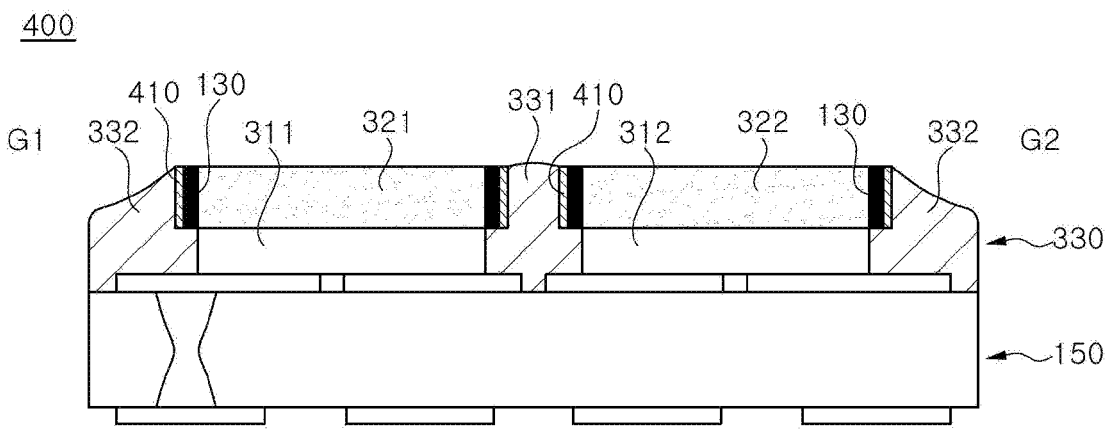

FIG. 10 and FIG. 11 are views of a light emitting device according to a fourth embodiment of the present disclosure. FIG. 10 is a top view of the light emitting device 400 according to the fourth embodiment. FIG. 11 is a cross-sectional view of the light emitting device 400 according to the fourth embodiment.

The light emitting device 400 according to the fourth embodiment includes a first light emitting chip 311, a second light emitting chip 312, a first wavelength conversion member 321, a second wavelength conversion member 322, reflective members 130, protective members 410, a barrier member 330, and a circuit board 150.

The first wavelength conversion member 321 is disposed on an upper surface of the first light emitting chip 311 and the second wavelength conversion member 322 is disposed on an upper surface of the second light emitting chip 312. In addition, each of the first wavelength conversion member 321 and the second wavelength conversion member 322 is formed with the reflective member 130 surrounding the side surfaces thereof.

According to this embodiment, the light emitting device 400 further includes the protective member 410 surrounding the side surfaces of each of the reflective members 130, as shown in FIG. 10. The protective member 410 prevents the reflective member 130 from being corroded or discolored through reaction with hydrogen sulfide or oxygen generated during a process or due to an external environment.

When the reflective member 130 is corroded or discolored by external materials, reflectivity of the reflective member 130 can be reduced. When light passes through a damaged portion of the reflective member 130, the light emitting device 400 can suffer from light blurring. In order to prevent this problem, the light emitting device 400 according to this embodiment includes the protective members 410 adapted to protect the reflective member 130. For example, the protective members 410 may be composed of at least one layer selected from a silicon nitride (SiNx) layer, a silicon oxide (SiO$_2$) layer, and a gold (Au) layer.

In addition, a bonding area of the barrier member 330 is increased by the protective members 410, thereby improving bonding strength of components inside the light emitting device 400.

Figure 12:
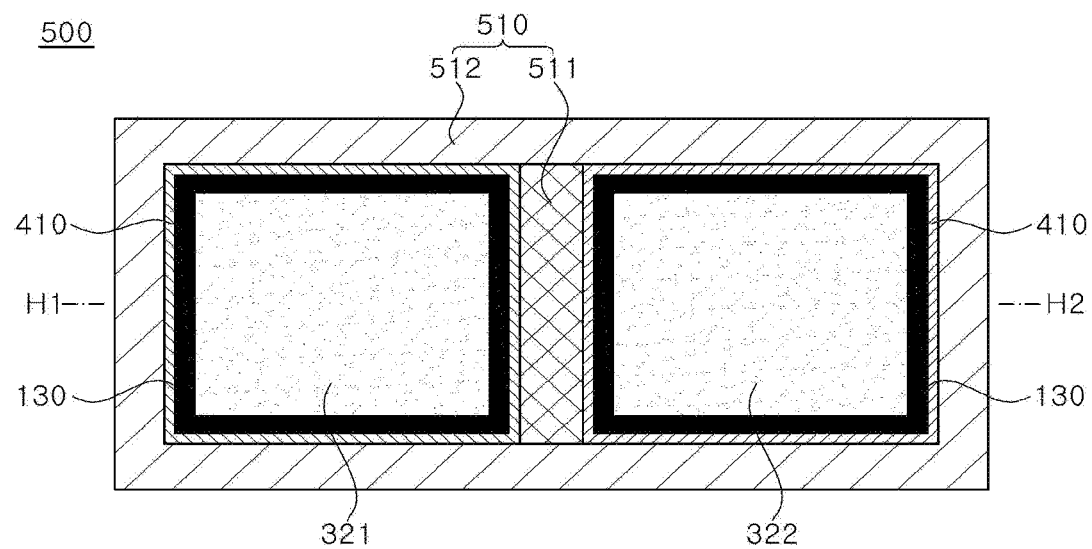
FIG. 12 and FIG. 13 are views of a light emitting device according to a fifth embodiment of the present disclosure.
Figure 13:
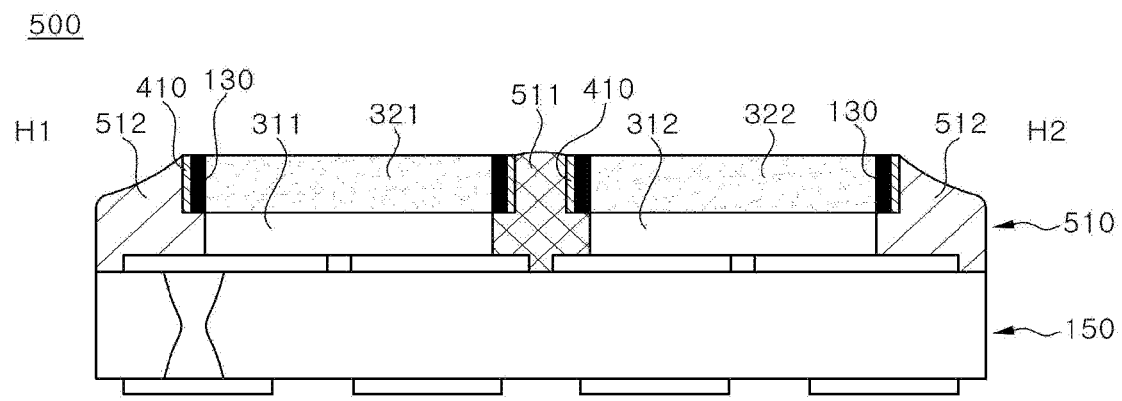

FIG. 12 and FIG. 13 are views of a light emitting device according to a fifth embodiment of the present disclosure. FIG. 12 is a top view of the light emitting device 500 according to the fifth embodiment. FIG. 13 is a cross-sectional view of the light emitting device 500 according to the fifth embodiment.

The light emitting device 500 includes a first light emitting chip 311, a second light emitting chip 312, a first wavelength conversion member 321, a second wavelength conversion member 322, reflective members 130, protective members 410, a barrier member 510, and a circuit board 150.

According to this embodiment, the barrier member 510 is divided into an outer wall 511 and an inner wall 512. The inner wall 511 refers to a portion of the barrier member 510 formed between the first light emitting chip 311 and the second light emitting chip 312 and between the first wavelength conversion member 321 and the second wavelength conversion member 322. In addition, the outer wall 512 refers to a portion of the barrier member 510 formed to surround side surfaces of the first light emitting chip 311, the first wavelength conversion member 321, the second light emitting chip 312 and the second wavelength conversion member 322 excluding a portion of the barrier member 510 on which the inner wall 511 is disposed. Here, the reflective members 130 and the protective members 410 may be formed between the first wavelength conversion member 321 and the second wavelength conversion member 322.

The barrier member 510 may be formed of a mixture of an epoxy or silicone resin and fillers. For example, the fillers may include at least one selected from titanium dioxide (TiO$_2$) for high refractivity and glass fibers for enhancement of strength. Strength of the barrier member 510 may be changed depending upon the amount of the fillers therein. That is, increase in amount of the fillers in the resin results in increase in strength of the barrier member 510.

The barrier member 510 may be formed by dispensing or screen printing the resin containing the fillers. Since dispensing enables precise deposition of a material in a narrow space through a narrow outlet of a dispenser, the barrier member 510 can be precisely formed. However, dispensing requires a material for the barrier member 510 to have low viscosity allowing the material to pass through the narrow outlet of the dispenser. The resin containing a large amount of the fillers has high viscosity, thereby making it difficult for the resin to form the barrier member 510 having high strength.

In this embodiment, the inner wall 511 of the barrier member 510 is formed by dispensing a material having a small amount of the fillers into a narrow space between the first light emitting chip 311 and the second light emitting chip 312. In addition, the outer wall 512 of the barrier member 510 is formed by screen printing a material having a large amount of the fillers on outer peripheral portions of the first light emitting chip 311 and the second light emitting chip 312. As a result, the barrier member 510 can be formed to include the outer wall 512 having high strength and the inner wall 511 precisely filled in a narrow space.

With the barrier member 510, the light emitting device 500 can have high strength while preventing light blurring and failure in light emission.

Although the light extraction members are not shown in FIG. 10 to FIG. 13, the light emitting devices according to the embodiments shown in FIG. 10 to FIG. 13 may further include the light extraction members such as the light extraction member 340 as described above in connection with FIG. 8.

Figure 14:
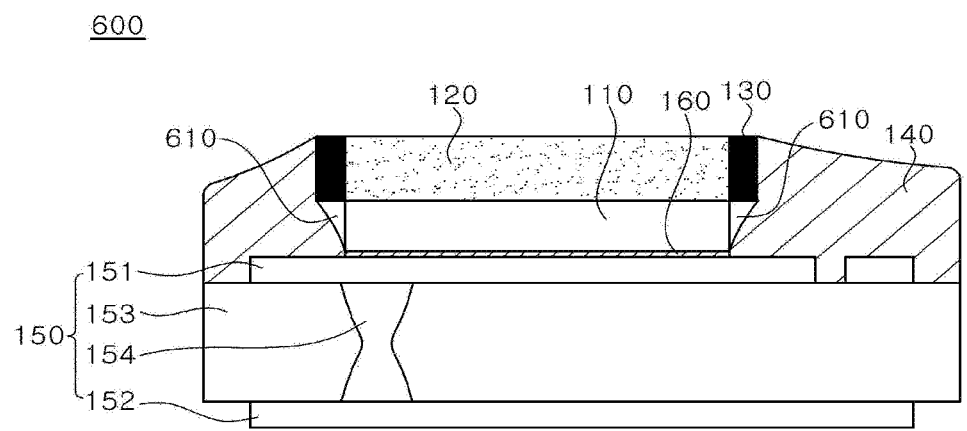
FIG. 14 is a view of a light emitting device according to a sixth embodiment of the present disclosure.

FIG. 14 is a view of a light emitting device according to a sixth embodiment of the present disclosure. Referring to FIG. 14, the light emitting device 600 according to the sixth embodiment includes a light emitting chip 110, a wavelength conversion member 120, reflective members 130, light extraction members 610, a barrier member 140, and a circuit board 150.

The light extraction members 610 are formed at both sides of the light emitting chip 110. In addition, each of the light extraction members 610 has a thickness gradually decreasing from an upper portion thereof in the downward direction and includes a curved outer wall facing the barrier member 140. According to this embodiment, the light extraction members 610 of the light emitting device 600 have a different structure from the light extraction members 340 of FIG. 8. The outer wall of the light extraction member 340 of FIG. 8 protrudes towards the barrier member 140, whereas the outer wall of the light extraction member 340 of FIG. 14 has a concave shape. However, it should be understood that the structure of the light extraction member 610 is not limited thereto and may be changed depending upon a light reflection direction, a process of forming the light extraction member 610, user selection, and the like.

The light extraction members 610 reflect light emitted through the side surfaces of the light emitting chip 110. Here, the thickness of the light extraction member 610 at each position thereof, or the radius of curvature of the outer wall thereof may be determined such that light can be reflected by the light extraction members 610 to enter the wavelength conversion member 120.

In the light emitting device 600 according to this embodiment, the light extraction members 610 reflect light emitted through the side surfaces of the light emitting chip 110 toward the wavelength conversion member 120, thereby improving light extraction efficiency. Further, in the light emitting device 600, the light extraction member 610 prevents the light from passing through the barrier member 140 disposed at the side surfaces of the light emitting chip 110, thereby preventing light blurring at the side surfaces of the barrier member 140.

Figure 15:
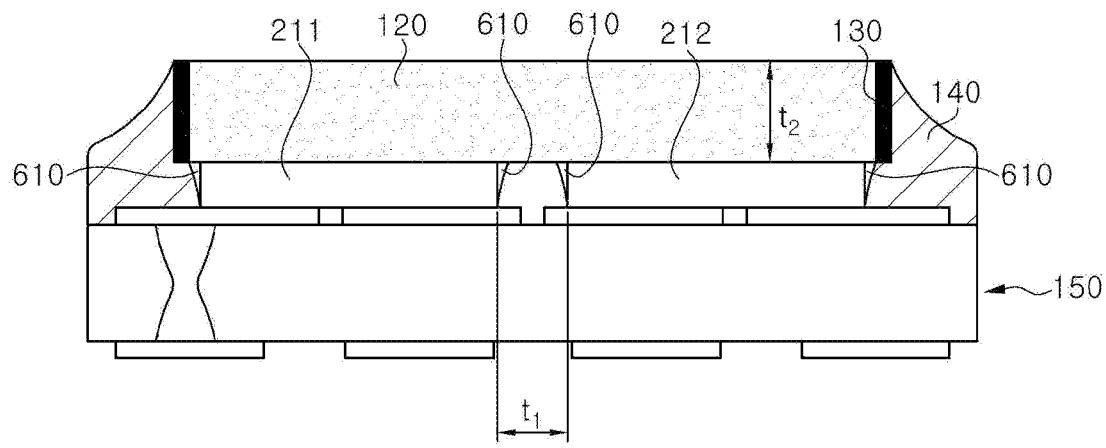
FIG. 15 is a view of a light emitting device according to a seventh embodiment of the present disclosure.

FIG. 15 is a view of a light emitting device according to a seventh embodiment of the present disclosure. Referring to FIG. 15, the light emitting device 700 according to the seventh embodiment includes a plurality of light emitting chips, a wavelength conversion member 120, reflective members 130, light extraction members 610, a barrier member 140, and a circuit board 150. For example, the plurality of light emitting chips includes a first light emitting chip 211 and a second light emitting chip 212. It should be understood that this structure is illustrated for convenience of description and the light emitting device 700 may include more light emitting chips.

The light extraction members 610 as shown in FIG. 15 are formed at both sides of each of the first light emitting chip 211 and the second light emitting chip 212. In addition, the light extraction members 610 have a thickness gradually decreasing from an upper portion thereof in the downward direction and include a curved outer wall facing the barrier member 140.

In the above embodiment, the light extraction members are formed at both sides of the light emitting chip while covering the entirety of the lower surface of the reflective member 130. However, in the light emitting device 700 according to this embodiment, each of the light extraction members 610 is formed at different locations from that of the above embodiment.

Referring to FIG. 15, both side surfaces of the wavelength conversion member 120 protrude outwards over the side surfaces of the first light emitting chip 211 and the second light emitting chip 212. Each of the light extraction members 610 is formed so as not to cover the lower surface of the reflective member 130 while covering a lower surface of a portion of each of the wavelength conversion members 610 protruding outward over the side surfaces of the first light emitting chip 211 and the second light emitting chip 212. In this structure, some fractions of light refracted by the light extraction member 610 may travel to the wavelength conversion member 120 through the first light emitting chip 211, or the second light emitting chip 212 and other fractions of the light may travel directly to the wavelength conversion member 120 through the light extraction member 610.

As such, the locations, thickness and radius of curvature of the light extraction members 610 as shown in FIGS. 14-15 may be changed in various ways by selection of those skilled in the art.

The first light emitting chip 211 and the second light emitting chip 212 may be disposed such that at least some fractions of light emitted therefrom cross each other inside the wavelength conversion member 120.

Further, the light extraction members 610 reflect light emitted through the side surfaces of the first light emitting chip 211 and the second light emitting chip 212 toward the wavelength conversion members 120. Here, some fractions of light emitted through the side surfaces of the first light emitting chip 211 and the second light emitting chip 212 and reflected by the light extraction members 610 may cross each other inside the wavelength conversion members 120 depending upon the radius of curvature of the light extraction members 610.

As such, the thickness of the wavelength conversion member 120 may be greater than a separation distance between the first light emitting chip 211 and the second light emitting chip 212 so as to allow light emitted through the side surfaces of the first light emitting chip 211 and the second light emitting chip 212 to cross each other inside the wavelength conversion member 120. For example, the separation distance t1 between the first light emitting chip 211 and the second light emitting chip 212 may be 190 μm or less. In addition, the wavelength conversion member 120 may have a thickness t2 of 200 μm or less.

When at least some fractions of light emitted through the side surfaces of the first light emitting chip 211 and the second light emitting chip 212 cross each other inside the wavelength conversion member 120 as in this embodiment, light having passed through the upper surface of the wavelength conversion member 120 has improved uniformity, as compared with the case where the light emitted through the side surfaces thereof does not cross each other inside the wavelength conversion member 120. That is, the light emitting device 700 according to this embodiment has high light uniformity.

The above descriptions focus on the constitution and effects of the light emitting device according to various embodiments when applied to a vehicle lamp. However, it should be understood that the effects of the light emitting device according to embodiments of the present disclosure are not limited to the vehicle lamp. The light emitting device according to the present disclosure may be applied not only to the vehicle lamp but also to display devices.

When light blurring occurs at a side surface of a light emitting device in a backlight unit of a display device, the display device can suffer from a phenomenon in which an outer periphery of the display device looks brighter than the central thereof. In addition, the display device can suffer from a phenomenon in which the whole display screen is smeared. Further, the display device can suffer from reduction in the contrast ratio and the viewing angle. Moreover, the display device can suffer from color deviation, causing deterioration in color quality.

However, the light emitting device according to embodiments of the present disclosure can prevent light blurring at the side surface of the light emitting device using the reflective member. Accordingly, when the light emitting device according to the present disclosure is applied to a display device, the display device can prevent the phenomenon in which the outer periphery of the display device looks brighter than the central thereof, the smearing phenomenon, reduction in contrast ratio and viewing angle, and color deviation.

Figure 16:
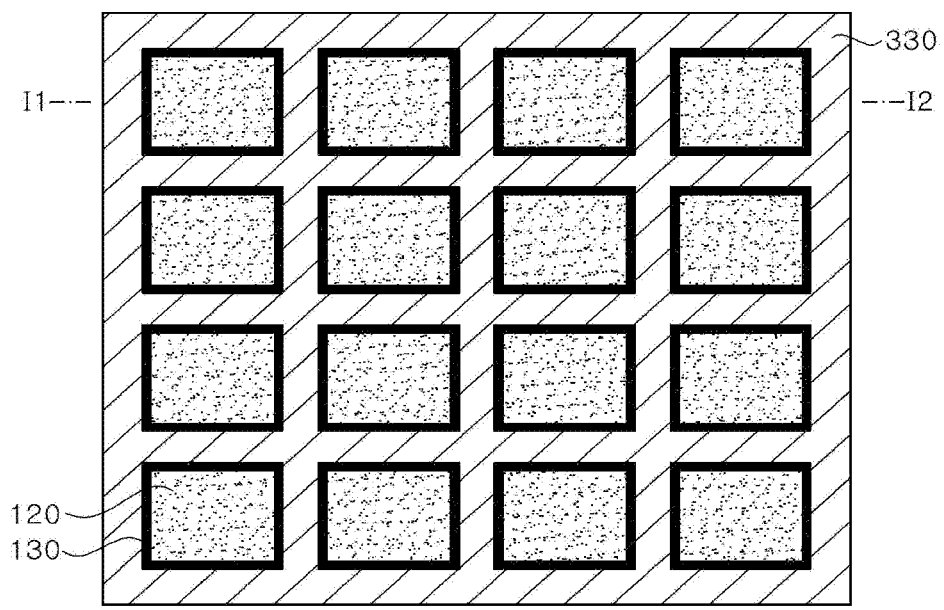
FIG. 16 and FIG. 17 are views of a light emitting device according to an eighth embodiment of the present disclosure.
Figure 17:
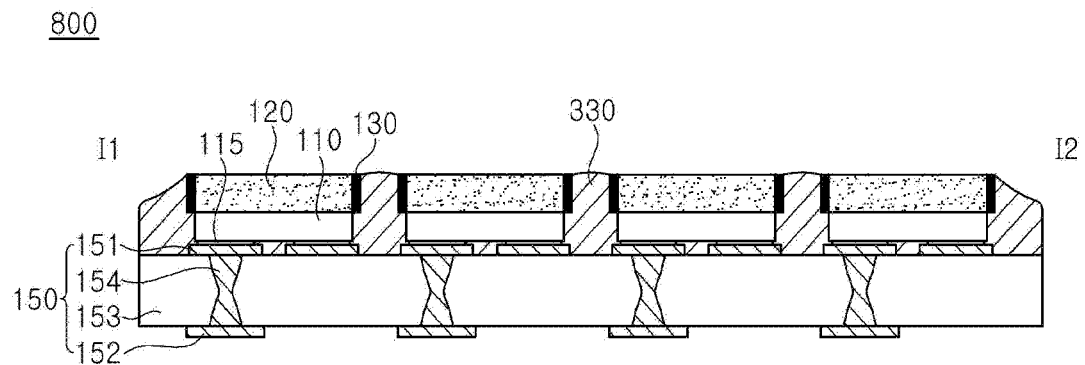

FIG. 16 and FIG. 17 are views of a light emitting device according to an eighth embodiment of the present disclosure. FIG. 16 is a top view of the light emitting device 800 according to the eighth embodiment and FIG. 17 is a cross-sectional view (I1-I2) of the light emitting device 800 shown in FIG. 16.

The light emitting device 800 according to the eighth embodiment of the present disclosure includes a substrate, a plurality of light emitting chips 110, wavelength conversion members 120, reflective members 130, and a barrier member 330. The substrate may be a circuit board 150 having a circuit pattern thereon.

The circuit board 150 includes an insulation layer 153 and an electrically conductive circuit pattern formed on the insulation layer 153. The circuit pattern includes a first circuit pattern 151, a second circuit pattern 152, and via holes 154. The first circuit pattern 151 is formed on an upper surface of the insulation layer 153. The second circuit pattern 152 is formed on a lower surface of the insulation layer 153. The via holes 154 are formed through the insulation layer 153 to electrically connect the first circuit pattern 151 to the second circuit pattern 152. The circuit pattern is electrically connected to the plurality of light emitting chips 110 mounted on the circuit board 150. Although the circuit board 150 is illustrated as the substrate having the light emitting chips 110 mounted thereon, it should be understood that the present disclosure is not limited thereto. The substrate may be selected from any type of substrate so long as the substrate is electrically connected to the light emitting chip 110 mounted thereon to supply electric power to the light emitting chips 110 for emission of light.

Each of the light emitting chips 110 is electrically connected to the circuit pattern of the circuit board 150. For example, the plurality of light emitting chips 110 may be mounted on the circuit board 150 by flip-chip bonding.

The plurality of light emitting chips 110 electrically connected to the circuit pattern may be individually operated in response to external signals. That is, each of the light emitting chips 110 may be individually operated to emit light or stop emission of light.

However, it should be understood that this embodiment is not limited thereto. The light emitting device 800 according to this embodiment may include an array of a plurality of light emitting chips. Here, in the array of light emitting chips, the light emitting chips are connected in series or in parallel through the circuit pattern to operate at the same time.

Referring to FIG. 17, the wavelength conversion member 120 is disposed on each of the light emitting chips 110. In addition, the reflective member 130 covers side surfaces of each of the wavelength conversion members 120, as shown in FIG. 16.

The barrier member 330 is formed on the circuit board 150 to cover side surfaces of the light emitting chips 110 and the reflective members 130. That is, the barrier member 330 is configured to expose an upper surface of each of the wavelength conversion members 120 and the reflective members 130.

Further, the barrier member 330 may be formed of a silicone resin. Alternatively, the barrier member 330 may be formed of a silicone resin containing fillers, such as a reflective material, glass fibers, and the like. Here, an inner wall of the barrier member 330 may have a smaller amount of the fillers than an outer wall thereof, as in the fifth embodiment shown in FIG. 12 and FIG. 13. In the barrier member 330, the outer wall refers to a portion of the barrier member 330 between the light emitting chips 110 and a side surface of the substrate 115 and the inner wall refers to a portion of the barrier member 330 disposed between the light emitting chips 110.

In recent years, there is tendency of miniaturization of the light emitting chip 110 while requiring high image quality of display devices. In order to realize high quality, the degree of definition of the display device can be increased by increasing the number of pixels thereof. To this end, the display device is increased in the number of light emitting chips 10 in the same region, thereby causing decrease in separation distance between the light emitting chips 110. Furthermore, as the contrast between the pixels becomes clearer, the display device can realize higher image quality through improvement in the degree of definition. However, when the light emitting chip 110 causing light blurring is used in the display device, the display device can suffer from light interference between the pixels, thereby causing deterioration in contrast between the pixels. As a result, the degree of definition of the display device is deteriorated due to light blurring of the light emitting chip 110, thereby causing deterioration in image quality of the display device.

The light emitting device 800 according to this embodiment includes the reflective member 130 covering the side surfaces of each of the wavelength conversion member 120 having a light exit surface through which light is emitted, thereby preventing the light from being emitted from other portions of the wavelength conversion member 120 excluding the light exit surface. Thus, the light emitting device 800 allows light to be emitted from each of the light emitting chips 110 only in an upward direction thereof by the reflective members 130, thereby preventing the light from affecting regions in which other adjacent light emitting chips 110 are disposed. Accordingly, the light emitting device 800 can prevent light interference between the pixels, thereby improving definition of the display device.

Figure 18:
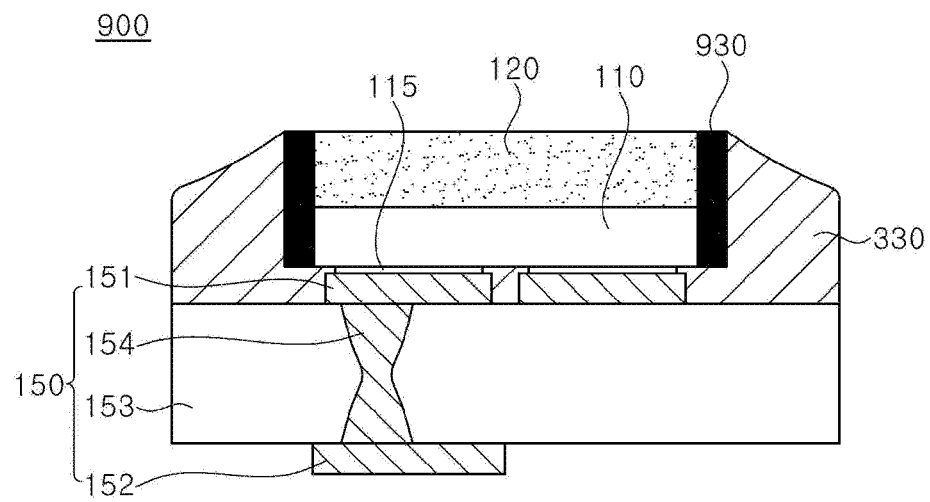
FIG. 18 is a view of a light emitting device according to a ninth embodiment of the present disclosure.

FIG. 18 is a view of a light emitting device according to a ninth embodiment of the present disclosure. The light emitting device 900 according to the ninth embodiment includes a circuit board 150, a light emitting chip 110, a wavelength conversion member 120, a reflective member 930, and a barrier member 330.

According to this embodiment, the reflective member 930 covers the side surfaces of the wavelength conversion member 120 and the light emitting chip 110. The reflective member 930 including a metal is formed to cover the side surfaces of the light emitting chip 110 without contacting a pair of electrode pads 115.

One of the electrode pads 115 of the light emitting chip 110 is electrically connected to an n-type semiconductor layer and the other electrode pad is electrically connected to a p-type semiconductor layer. In addition, the electrode pads 115 are exposed from the light emitting chip 110 and electrically connected to the circuit pattern of the circuit board 150.

In the light emitting device 900 according to this embodiment, the reflective member 930 is formed to cover all side surfaces of the light emitting chip 110 without contacting the electrode pads 115.

With this structure, the reflective member 930 prevents light from emitted through the side surfaces of the barrier member 330 by reflecting light emitted through the side surfaces of the wavelength conversion member 120 and the side surfaces of the light emitting chip 110. Accordingly, even with a structure wherein the barrier member 330 formed on the side surfaces of the wavelength conversion member 120 and the light emitting chip 110 has a thin thickness, the light emitting device 900 can prevent light blurring. That is, the light emitting device 900 according to this embodiment allows reduction in thickness of the barrier member 330 formed on the side surfaces of the wavelength conversion member 120 and the light emitting chip 110.

Figure 19:
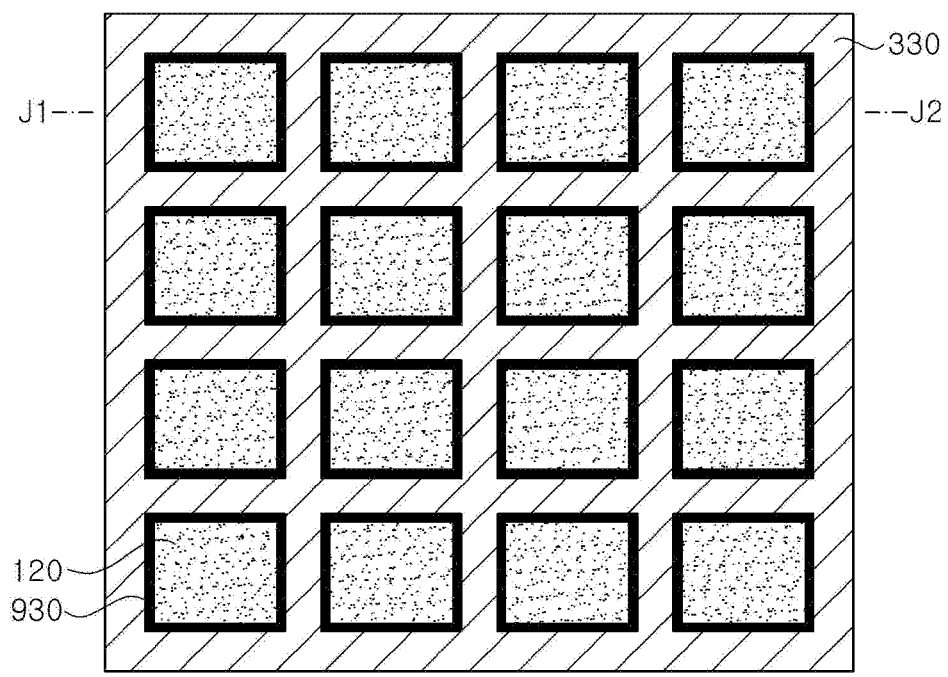
FIG. 19 to FIG. 21 are views of light emitting devices according to tenth and eleventh embodiments of the present disclosure.
Figure 20:
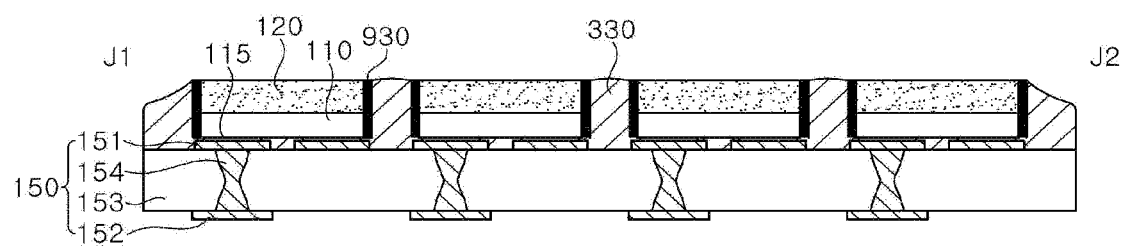
Figure 21:
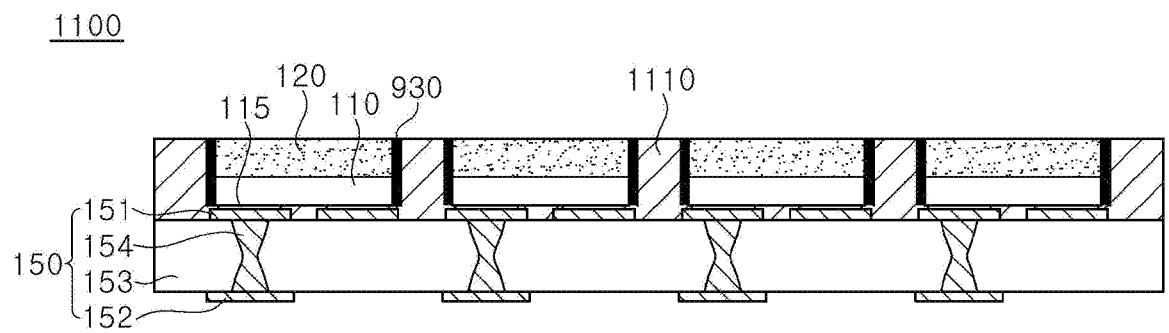

FIG. 19 to FIG. 21 are views of light emitting devices according to tenth and eleventh embodiments of the present disclosure. FIG. 19 is a top view of the light emitting device according to the tenth embodiment. FIG. 20 is a cross-sectional view of the light emitting device according to the tenth embodiment. In addition, FIG. 21 is a cross-sectional view of the light emitting device according to the eleventh embodiment.

Each of the light emitting devices 1000, 1100 according to the tenth and eleventh embodiments includes a circuit board 150, a plurality of light emitting chips 110, a wavelength conversion member 120, a reflective member 930, and barrier members 330, 1110.

In the light emitting devices 1000, 1100 according to these embodiments, the plural light emitting chips 110 are mounted on the circuit board 150 having an electrically conductive circuit pattern thereon. In addition, each of the light emitting chips 110 is electrically connected to the circuit pattern of the circuit board 150.

The plurality of light emitting chips 110 electrically connected to the circuit pattern may be individually operated in response to external signals. Alternatively, the plurality of light emitting chips 110 may form an array of light emitting chips operating at the same time, and the light emitting devices 1000, 1100 as shown in FIGS. 19-21 may include a plurality of arrays mounted on the circuit board 150.

According to this embodiment, each of the light emitting chips 110 is formed on an upper surface thereof with the wavelength conversion members 120. In addition, the reflective members 930 is formed to surround the side surfaces of the light emitting chip 110 and the side surfaces of the wavelength conversion member 120. The wavelength conversion member 120 and the reflective member 930 formed on each of the light emitting chips 110 will be described with reference to FIG. 18.

Referring to FIG. 20, in the light emitting device 1000 according to the tenth embodiment, the barrier member 330 disposed at outer sides of the light emitting chips 110 at opposite sides of the circuit board has a thickness gradually increasing from an upper portion thereof in a downward direction thereof. That is, a portion of the barrier member 330 disposed between each of the light emitting chips 110 and a side surface of the circuit board 150 has a thickness gradually increasing from an upper portion thereof in the downward direction. In addition, the barrier member 330 disposed between the light emitting chips 110 has a convex upper surface.

In the light emitting device 1000 according to the tenth embodiment, the barrier member 330 is formed by dispensing. Here, when an excess of a material for the barrier member 330 is dispensed, the barrier member 330 can partially cover a light exit surface of the wavelength conversion member 120, thereby causing reduction in luminous area. Accordingly, in consideration of this structure, the material for the barrier member 330 may be ejected onto the circuit board 150 upon formation of the barrier member 330. Accordingly, the barrier member 330 disposed at the outer sides of the light emitting chips 110 at the opposite sides of the circuit board has a lower height than the upper surface of the wavelength conversion member 120. Here, the material for the barrier member 330 is moved along the surface of the reflective member 930 due to surface tension, thereby providing a structure where the portion of the barrier member 330 disposed at the outer sides of the light emitting chips 110 at the opposite sides of the circuit board has a thickness gradually decreasing from a lower portion thereof in an upward direction thereof.

Further, a region between the light emitting chips 110 is narrower than a region between one side of the circuit board 150 and a side surface of each of the light emitting chips 110 at the opposite sides of the circuit board 150. Accordingly, when a certain amount of the material for the barrier member 330 is ejected to each region, a predetermined amount of the material can be deposited on the region between the light emitting chips 110. Here, the barrier member 330 can have a convex upper surface by curing the material for the barrier member 330, as shown in FIG. 20.

Referring to FIG. 21, in the light emitting device 1100 according to the eleventh embodiment, the barrier member 1110 may have a flat upper surface. For example, the barrier member 1110 may be formed by screen printing. The barrier member 1110 may be formed by depositing a predetermined amount of the material for the barrier member 1110 in each region through a mask having openings corresponding to locations at which the barrier member 1110 will be formed. Since screen printing is performed by depositing a predetermined amount of the material corresponding to each region, the upper surface of the barrier member 1110 can have a flat structure.

Alternatively, the barrier member 1110 may be formed by dispensing. Here, the material for the barrier member 1110 may be ejected in an excess amount to each region. Then, the barrier member 1110 covering the upper surface of the wavelength conversion member 120 and the upper surface of the reflective member 930 is removed by polishing in various ways, whereby the upper surface of the barrier member 1110 can be flattened.

It should be understood that the barrier member 1110 having a flat upper surface is not limited to this embodiment of the present disclosure. That is, the barrier member 1110 having a flat upper surface may be applied to light emitting devices according to other embodiments of the present disclosure.

FIG. 22 to FIG. 25 are views of light emitting devices according to twelfth to fifteenth embodiments of the present disclosure. Each of the light emitting devices 1200, 1300, 1400, 1500 according to the twelfth to fifteenth embodiments includes a circuit board 150, a light emitting chip 110, a wavelength conversion member 120, a first reflective member 1210, a second reflective member 1220, and a barrier member 1110.

Figure 22:
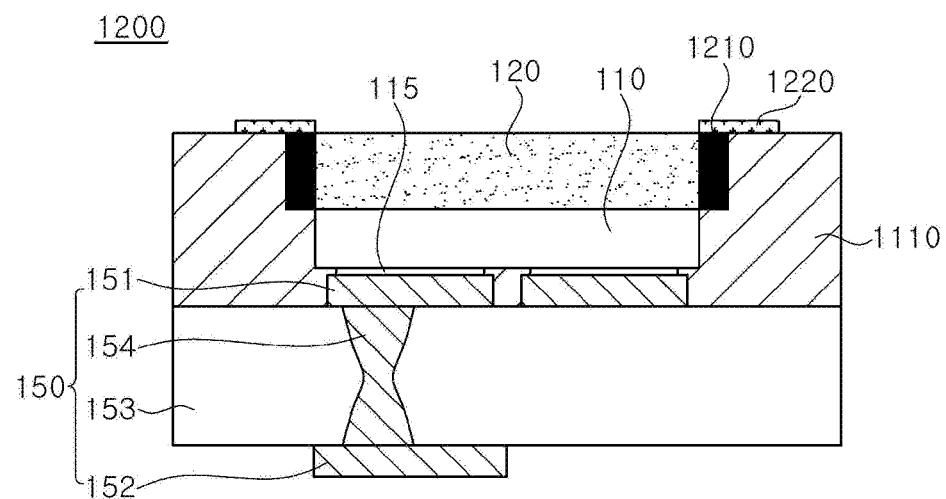
FIG. 22 to FIG. 25 are views of light emitting devices according to twelfth to fifteenth embodiments of the present disclosure.
Figure 24:
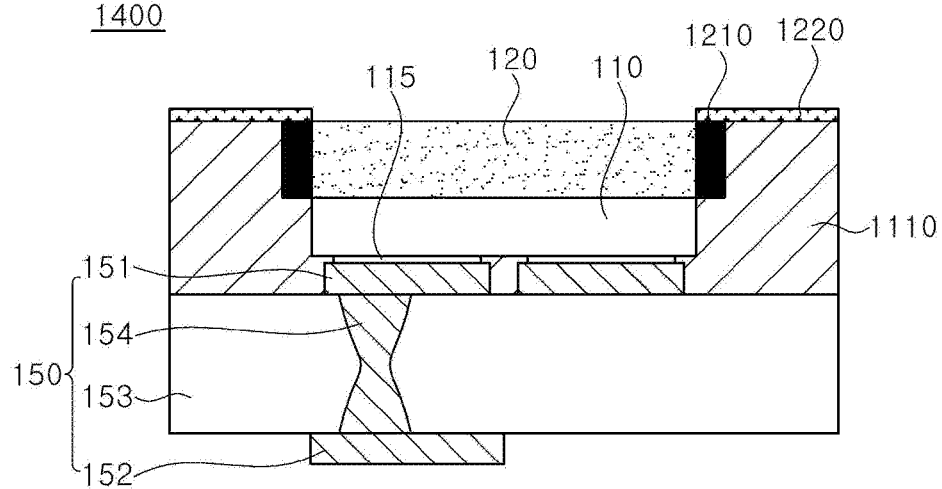

Here, the first reflective member 1210 corresponds to the reflective member according to the other embodiments described above. Referring to FIG. 22 and FIG. 24, the light emitting devices 1200, 1400 have a structure wherein the first reflective member 1210 covers only the side surfaces of the wavelength conversion member 120. However, it should be understood that the light emitting devices 1200, 1400 are not limited to this structure. Like the reflective member 130 shown in FIG. 18, the first reflective member 1210 may be formed to cover the side surfaces of the light emitting chip 110 and the wavelength conversion member 120.

In addition, referring to FIG. 22 and FIG. 24, in the light emitting device 1200, 1400, the barrier member 1110 has a flat upper surface. However, it should be understood that the barrier member 1110 of each of the light emitting devices 1200, 1400 is not limited thereto. Like the barrier member 330 shown in FIG. 20, the barrier member 1110 may have a structure wherein the thickness of the barrier member 1110 gradually increases from an upper portion thereof in the downward direction thereof.

The second reflective member 1220 covers at least part of an upper surface of the barrier member 1110.

Some fraction of light traveling toward the first reflective member 1210 may be directed toward the upper surface of the barrier member 1110 through the first reflective member 1210 and the barrier member 1110 instead of being reflected by the first reflective member 1210. Furthermore, as shown in FIG. 22 and FIG. 24, in the structure wherein the first reflective member 1210 is formed to cover only the side surfaces of the wavelength conversion member 120 corresponding thereto, light emitted through the side surfaces of the light emitting chip 110 may travel toward the upper surface of the barrier member 1110 after passing through the barrier member 1110.

The second reflective member 1220 reflects light having passed through the barrier member 1110 or through both the first reflective member 1210 and the barrier member 1110 and reaching the second reflective member 1220. The second reflective member 1220 may be formed of the same material as the first reflective member 1210. Alternatively, the second reflective member 1220 adapted to reflect light may be formed of a different material from the first reflective member 1210.

Referring to FIG. 22, in the light emitting device 1200 according to the twelfth embodiment, the second reflective member 1220 covers the upper surface of the first reflective member 1210 and a portion of the upper surface of the barrier member 1110. Accordingly, the barrier member 1110 of the light emitting device 1200 is not exposed between the first reflective member 1210 and the second reflective member 1220.

Alternatively, the second reflective member 1220 may be formed to surround the periphery of the upper surface of the first reflective member 1210 instead of covering the upper surface of the first reflective member 1210. In this embodiment, the second reflective member 1220 may contact the periphery of the upper surface of the first reflective member 1210. Accordingly, the barrier member 1110 may not be exposed between the first reflective member 1210 and the second reflective member 1220.

In the light emitting device 1200 according to the twelfth embodiment, the barrier member 1110 is not exposed between the first reflective member 1210 and the second reflective member 1220, thereby preventing light emission between the first reflective member 1210 and the second reflective member 1220.

Figure 23:
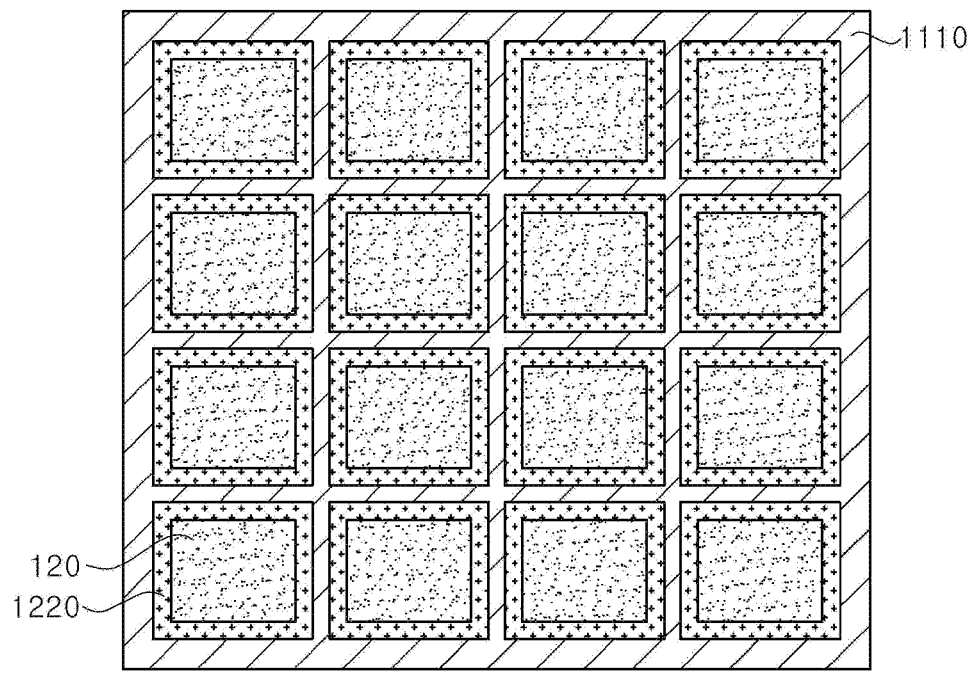

FIG. 23 is a top view of the light emitting device 1300 according to the thirteenth embodiment, which includes a plurality of light emitting chips 110 mounted on the circuit board 150. In the light emitting device 1300 according to the thirteenth embodiment, the wavelength conversion member 120, the first reflective member 1210 and the second reflective member 1220 formed on each of the light emitting chips 110 are the same as those of the light emitting device 1200 according to the twelfth embodiment.

Referring to FIG. 24, in the light emitting device 1400 according to the fourteenth embodiment, the second reflective member 1220 covers the entirety of the upper surface of the barrier member 1110. Here, the second reflective member 1220 may be formed to cover the upper surface of the first reflective member 1210, as shown in FIG. 24. Alternatively, the second reflective member 1220 may be formed to surround the periphery of the upper surface of the first reflective member 1210 instead of covering the upper surface of the first reflective member 1210.

Figure 25:
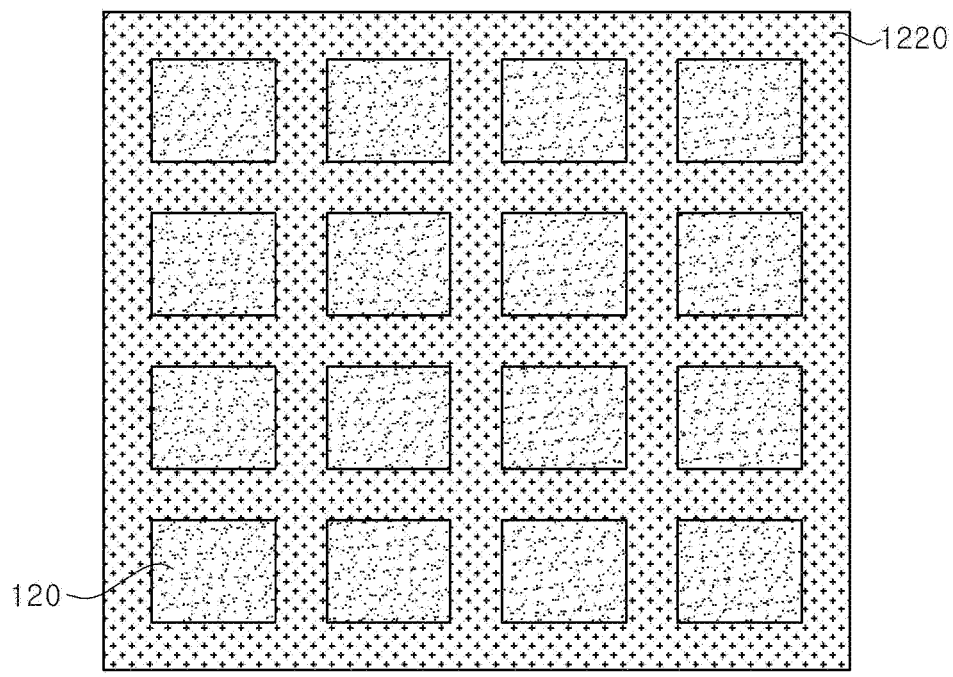

FIG. 25 is a top view of the light emitting device 1500 according to the fifteenth embodiment, which includes a plurality of light emitting chips 110 mounted on the circuit board 150. In the light emitting device 1500 according to the fifteenth embodiment, the wavelength conversion member 120, the first reflective member 1210 and the second reflective member 1220 formed on each of the light emitting chips 110 are the same as those of the light emitting device 1400 according to the fourteenth embodiment.

The light emitting devices 1200, 1300, 1400, 1500 according to these embodiments secure double prevention of emission of light through the barrier member 1110 using the first reflective member 1210 and the second reflective member 1220. Accordingly, the light emitting devices 1200, 1300, 1400, 1500 can more securely prevent light blurring.

In addition, the light emitting devices 1200, 1300, 1400, 1500 according to these embodiments can effectively prevent emission of light through the upper surface of the barrier member 1110 even with reduction in thickness of the first reflective member 1210 using the second reflective member 1220. Alternatively, the light emitting devices 1200, 1300, 1400, 1500 according to these embodiments can effectively prevent emission of light through the upper surface of the barrier member 1110 even with reduction in thickness of the second reflective member 1220 using the first reflective member 1210. Accordingly, the light emitting devices 1200, 1300, 1400, 1500 according to these embodiments enable reduction in width or thickness, as compared with the structure including a single reflective member.

Although some embodiments have been described herein with reference to the accompanying drawings, it should be understood that these embodiments are provided for illustration only and are not to be construed in any way as limiting the present disclosure. Therefore, it should be understood that the scope of the present disclosure should be defined by the appended claims and equivalents thereto.

The invention claimed is:

1. A light emitting device comprising:
   a substrate;
   plural light emitting chips mounted on the substrate, the plural light emitting chips comprising a first light emitting chip and a second light emitting chip;
   a first wavelength conversion member covering an upper surface of the first light emitting chip;
   a first reflective area covering a side surface of the first wavelength conversion member;
   a barrier member comprising:
      an outer wall covering side surfaces of the first light emitting chip and the first reflective area; and
      an inner wall disposed between the first light emitting chip and the second light emitting chip;
   wherein an upper portion of the outer wall of the barrier member disposed between the first light emitting chip and a side surface of the substrate has a thickness gradually increasing from an upper surface thereof in a downward direction thereof, and;
   the outer wall of the barrier member contains a larger amount of fillers than the inner wall thereof.

2. The light emitting device according to claim 1, wherein the barrier member has a flat upper surface.

3. The light emitting device according to claim 1, wherein the first wavelength conversion member and the first reflective area are formed on each of the first light emitting chips.

4. The light emitting device according to claim 3, wherein each of the first reflective areas is spaced apart from another first reflective area adjacent thereto.

5. The light emitting device according to claim 1, wherein the first reflective area covers a side surface of the wavelength conversion member.

6. The light emitting device according to claim 1, wherein the first reflective area comprises silver (Ag), aluminum (Al), or both.

7. The light emitting device according to claim 1, wherein the first wavelength conversion member has a greater width than, or the same width as the first light emitting chip.

8. The light emitting device according to claim 1, wherein the first wavelength conversion member comprises a mixture of a wavelength conversion material and one of an epoxy resin, a silicone resin, glass and a ceramic material.

9. The light emitting device according to claim 8, wherein the first wavelength conversion member further comprises a reflective material.

10. The light emitting device according to claim 1, further comprising:
    a second reflective area covering an upper surface of the barrier member.

11. The light emitting device according to claim 10, wherein the second reflective area is disposed to contact an upper surface of the first reflective area.

12. The light emitting device according to claim 11, wherein the second reflective area:
    covers the upper surface of the first reflective area, or is formed along a periphery of the upper surface of the first reflective area, and
    the second reflective area further covers a portion of the upper surface of the barrier member.

13. The light emitting device according to claim 11, wherein the second reflective area covers the entirety of the upper surface of the barrier member, or covers the entirety of the upper surface of the barrier member and the upper surface of the first reflective area.

14. The light emitting device according to claim 10, wherein the second reflective area comprises silver (Ag), aluminum (Al), or both.

15. The light emitting device according to claim 1, wherein the substrate is a circuit board comprising an insulation layer and a circuit pattern.

16. The light emitting device according to claim 15, wherein the circuit pattern comprises:
    a first circuit pattern formed on an upper surface of the insulation layer and electrically connected to the first light emitting chip;
    a second circuit pattern formed on a lower surface of the insulation layer; and
    a via hole formed through the insulation layer and electrically connecting the first circuit pattern to the second circuit pattern.

17. The light emitting device according to claim 16, wherein one end of the first circuit pattern is disposed in the middle between one side surface of the first light emitting chip and the outer wall of the barrier member, or disposed between the outer wall of the barrier member and the middle between one side surface of the first light emitting chip and the outer wall of the barrier member.

18. The light emitting device according to claim 16, wherein the via hole has a width gradually decreasing from the upper surface of the insulation layer toward a middle point of the insulation layer and from the lower surface of the insulation layer toward the middle point of the insulation layer.

19. The light emitting device according to claim 1, wherein the first light emitting chip and the second light emitting chip are arranged parallel to each other from one side of the substrate to the other side thereof,
    the first wavelength conversion member has a width equal to a width from one side surface of the first light emitting chip disposed at the one side to one side surface of the first light emitting chip disposed at the other side, and
    the one side surface of the first light emitting chip faces an inner wall of the barrier member.

20. The light emitting device according to claim 1, wherein:
    the second light emitting chip spaced apart from the first light emitting chip in a lateral direction,
    the second light emitting chip being disposed such that one side surface of the second light emitting chip faces one side surface of the first light emitting chip.

21. The light emitting device according to claim 20, further comprising:
    a second wavelength conversion member covering an upper surface of the second light emitting chip.

22. The light emitting device according to claim 21, wherein the second wavelength conversion member comprises a mixture of a wavelength conversion material and one of an epoxy resin, a silicone resin, glass and a ceramic material.

23. The light emitting device according to claim 22, wherein the first wavelength conversion member and the second wavelength conversion member comprise different wavelength conversion materials to convert light into different wavelengths.

24. The light emitting device according to claim 20, wherein the inner wall of the barrier member has a convex upper surface.

25. The light emitting device according to claim 1, further comprising:

a protective member disposed between the first reflective member and the barrier member to protect the first reflective area.

26. The light emitting device according to claim 25, wherein the protective member comprises one or more of a silicon nitride (SiNx) layer, a silicon oxide (SiO2) layer and a gold (Au) layer.

27. The light emitting device according to claim 21, wherein the second wavelength conversion member further comprises a reflective material.

* * * * *